(12) United States Patent
Narayanan et al.

(10) Patent No.: US 9,229,055 B2
(45) Date of Patent: Jan. 5, 2016

(54) DECOMPRESSED SCAN CHAIN MASKING CIRCUIT SHIFT REGISTER WITH LOG2(N/N) CELLS

(71) Applicant: Texas Instruments Incorporated, Dallas, TX (US)

(72) Inventors: Prakash Narayanan, Karnataka (IN); Arvind Jain, Karnataka (IN); Sundarrajan Subramanian, Karnataka (IN); Rubin A. Parekhji, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/743,720

(22) Filed: Jun. 18, 2015

(65) Prior Publication Data

US 2015/0285860 A1    Oct. 8, 2015

Related U.S. Application Data

(62) Division of application No. 14/487,538, filed on Sep. 16, 2014, now Pat. No. 9,091,729, which is a division of application No. 12/904,303, filed on Oct. 14, 2010, now Pat. No. 8,887,018.

(30) Foreign Application Priority Data

Jun. 11, 2010 (IN) .......................... 1625/CHE/2010

(51) Int. Cl.
  *G06F 11/00* (2006.01)
  *G01R 31/3177* (2006.01)
  *G01R 31/3185* (2006.01)

(52) U.S. Cl.
  CPC .... *G01R 31/3177* (2013.01); *G01R 31/318536* (2013.01); *G01R 31/318547* (2013.01)

(58) Field of Classification Search
  CPC ................... G01R 31/318547; G01R 31/3177; G01R 31/318563; G01R 31/318566; G01R 31/31703; G01R 31/318544; G01R 31/318583; G01R 31/318536; G01R 31/318558; G01R 31/31705
  USPC ......................................... 714/725–731, 738
  See application file for complete search history.

(56) References Cited

U.S. PATENT DOCUMENTS

| | | | | |
|---|---|---|---|---|
| 7,032,148 B2 * | 4/2006 | Wang | ............. | G01R 31/318547 714/726 |
| 7,093,175 B2 * | 8/2006 | Rajski | ............. | G01R 31/31813 714/728 |
| 7,134,061 B2 * | 11/2006 | Agashe | .......... | G01R 31/318552 714/726 |

(Continued)

*Primary Examiner* — Bryce Bonzo
*Assistant Examiner* — Elmira Mehrmanesh
(74) *Attorney, Agent, or Firm* — Lawrence J. Bassuk; Frank D. Cimino

(57) ABSTRACT

Electronic scan circuitry includes a decompressor (510), a plurality of scan chains (520.i) fed by the decompressor (510), a scan circuit (502, 504) coupled to the plurality of scan chains (520.i) to scan them in and out, a masking circuit (590) fed by the scan chains (520.i), and a scannable masking qualification circuit (550, 560, 580) coupled to the masking circuit (590), the masking qualification circuit (550, 560, 580) scannable by scan-in of bits by the decompressor (510) along with scan-in of the scan chains (520.i), and the scannable masking qualification circuit (550, 560, 580) operable to hold such scanned-in bits upon scan-out of the scan chains through the masking circuit (590). Other scan circuitry, processes, circuits, devices and systems are also disclosed.

11 Claims, 11 Drawing Sheets

(56) References Cited

U.S. PATENT DOCUMENTS

| | | | | |
|---|---|---|---|---|
| 7,523,370 B1* | 4/2009 | Keller | G01R 31/318547 | 714/726 |
| 7,657,790 B2* | 2/2010 | Whetsel | G01R 31/318536 | 324/750.3 |
| 7,743,302 B2* | 6/2010 | Rajski | G01R 31/318566 | 714/729 |
| 7,823,034 B2* | 10/2010 | Wohl | G01R 31/318547 | 714/726 |
| 7,913,137 B2* | 3/2011 | Mukherjee | G01R 31/318547 | 714/729 |
| 8,205,125 B2* | 6/2012 | Hales | G01R 31/318533 | 714/727 |
| 8,286,042 B2* | 10/2012 | Gangasani | G01R 31/318385 | 714/30 |
| 8,458,541 B2* | 6/2013 | Jain | G01R 31/318547 | 714/726 |
| 8,539,293 B2* | 9/2013 | Lee | G01R 31/318547 | 714/30 |
| 8,887,018 B2* | 11/2014 | Narayanan | G01R 31/318536 | 714/729 |
| 9,091,729 B2* | 7/2015 | Narayanan | G01R 31/318547 | 1/1 |
| 2004/0237015 A1* | 11/2004 | Abdel-Hafez | G01R 31/318591 | 714/726 |
| 2005/0060625 A1* | 3/2005 | Wang | G01R 31/318547 | 714/727 |
| 2006/0111873 A1* | 5/2006 | Huang | G01R 31/318547 | 702/185 |
| 2007/0088999 A1* | 4/2007 | Chao | G01R 31/318547 | 714/726 |
| 2007/0234157 A1* | 10/2007 | Rajski | G01R 31/318547 | 714/728 |
| 2008/0294953 A1* | 11/2008 | Cheng | G01R 31/318547 | 714/726 |
| 2008/0307240 A1* | 12/2008 | Dahan | G06F 1/06 | 713/320 |
| 2008/0313513 A1* | 12/2008 | Gizdarski | G01R 31/318335 | 714/729 |
| 2009/0106613 A1* | 4/2009 | Goyal | G01R 31/318547 | 714/729 |
| 2009/0119559 A1* | 5/2009 | Foutz | G06F 11/267 | 714/729 |
| 2009/0228749 A1* | 9/2009 | Rajski | G01R 31/318547 | 714/726 |
| 2009/0300446 A1* | 12/2009 | Rajski | G01R 31/318547 | 714/726 |
| 2010/0017760 A1* | 1/2010 | Kapur | G01R 31/318544 | 716/132 |
| 2010/0083199 A1* | 4/2010 | Wohl | G01R 31/318547 | 716/136 |
| 2010/0090706 A1* | 4/2010 | Malach | G01R 31/318547 | 324/537 |
| 2010/0115354 A1* | 5/2010 | Whetsel | G01R 31/318536 | 714/726 |

* cited by examiner

DECOMPRESSED SCAN CHAIN MASKING CIRCUIT SHIFT REGISTER WITH LOG2(N/N) CELLS

CROSS-REFERENCES TO RELATED APPLICATIONS

This application is a divisional of U.S. application Ser. No. 14/487,538, filed on Sep. 16, 2014, now U.S. Pat. No. 9,091,729, granted Jul. 28, 2015.

Which was a divisional of application Ser. No. 12/904,303, filed Oct. 14, 2010, now U.S. Pat. No. 8,887,018, granted Nov. 11, 2014;

And is related to India Patent Application 1625/CHE/2010 "Compressed Scan Chain Diagnosis by Internal Chain Observation Processes, Circuits, Devices and Systems" filed Jun. 11, 2010, for which priority is claimed under the Paris Convention and 35 U.S.C. 119 and all other applicable law, and which is incorporated herein by reference in its entirety.

FIELD OF THE INVENTION

The field of the invention includes design-for-test circuits in integrated circuits, and processes of making and testing integrated circuits.

BACKGROUND

In the integrated circuit field, scan testing involves introducing sequences of ones and zeros, called scan bits, into the integrated circuits for testing them. Scan compression is a way of reducing the volume of such bits sent from the tester to an integrated circuit.

Scan compression is mainstream technology today. A Glossary is provided in TABLE 1.

For some other background, see U.S. Pat. Nos. 7,657,790 and 7,743,302, and U.S. Published Patent Applications 20090228749 and 20050060625.

Hitherto, scan compression architectures have had three components:
1. Decompressor: Decompresses input channel data into internal scan-ins. (A respective scan channel pertains to any given set of scan chains among a number of such sets that make up all the scan chains in the integrated circuit.) Different decompressor architectures are available in the industry, e.g. XOR decompressor, mux/demux decompressor, LFSR (Linear Feedback Shift Register) based decompressor.
2. Compactor/Compressor: Compresses internal scan-outs data into output channels. Different compressor architectures are available in the industry for e.g. XOR compressor, and MISR (Multiple Input Signature Register) based compressor. These conventional compressors are susceptible to unknowns (Xs) in the circuit. For example, an unknown X in one internal STUMP can corrupt a whole signature in an MISR based compressor. An unknown X can cause masking of multiple internal scan chains (STUMPS) in an Xor (exclusive-OR) based compressor. So the presence of Xs can cause substantial test coverage loss.
3. X-tolerance Logic: X-tolerance is a DFT technique to provide immunity to compressor from unknowns (Xs) in the functional circuit under test (DUT). Logic is provided to block the internal scan chain having such unknowns (Xs), such as by including an AND gate per internal scan chain. A second part is control logic that generates blocking controls for the AND gates. Control logic programmation can be done through ATPG (if control logic is getting input data from decompressor or from top level input channels) or through external interface like IEEE 1500 scan interface of FIG. 8, etc.

X-tolerance techniques that overcome current industry architecture limitations and provide better compression and debug capabilities are needed and would be most desirable. For instance, suppose an architecture always bypasses the compactor if one or more chains are having Xs, to prevent merging of multiple scan chains in the compactor, and hence prevent corruption of the compacted result by Xs. However, this results in significant loss of compression since the compactor is bypassed. in presence of Xs.

Compressed scan chains hitherto have been difficult to use to do debug and result in generation of bypass patterns to isolate the flip-flop that is failing. In some cases a tool can generate patterns where internal scan chains are observed but this means regeneration of patterns and does neither mean that the same data will be observed, nor guarantee same paths will be excited, and has other problems.

While test data compression is useful to reduce test data volume and test application time, the reduced observability (due to output response compaction) results in two new issues:

(a) Tasks of debug and diagnostics, wherein the cause of one or more failing outputs in one or more cycles must be diagnosed to one or a set of flip-flops in the design (which in turn drive these outputs), are rendered more difficult. Difficulty arises since (i) the fault localization to the set of failing flip-flops must now be performed with less volume of output data, i.e. reduced observability, and (ii) a given fault may be exercised fewer times as the input decompressor drives few primary scan inputs into a larger number of internal scan inputs, thereby impairing the ability to excite a fault multiple times.

(b) Distinguishing groups of internal scan chains for the purpose of test coverage improvement is rendered more difficult since per cycle individual scan chain observability is no longer possible, on account of multiple internal scan chain outputs being grouped together into fewer primary scan outputs through the output compactor logic.

The issues in (a) and (b) are addressed traditionally by switching the circuit operation from scan compression mode to a prior type of a scan bypass mode. The latter has inherent disadvantages of (i) requiring a larger number of test cycles and (ii) of introducing a different state of the circuit as compared to that which actually caused a pattern to fail.

In view of the above problems, it would be desirable to somehow provide solutions in this field that can address the problems and be economical in terms of chip real estate, test time and test complexity.

SUMMARY OF THE INVENTION

Generally, and in one form of the invention, electronic scan circuitry includes a decompressor, a plurality of scan chains fed by the decompressor, a scan circuit coupled to the plurality of scan chains to scan them in and out, a masking circuit fed by the scan chains, and a scannable masking qualification circuit coupled to the masking circuit, the masking qualification circuit scannable by scan-in of bits by the decompressor along with scan-in of the scan chains, and the scannable masking qualification circuit operable to hold such scanned-in bits upon scan-out of the scan chains through the masking circuit.

Generally, and in another form of the invention, electronic scan circuitry includes a decompressor, a plurality of scan chains fed by the decompressor, a masking logic fed by the plurality of scan chains, the scan chains scannable to scan them out in scan out cycles through the masking logic, and a scannable masking qualification circuit coupled to the masking logic and operable both to select at least one of the plurality of scan chains for disqualification and to execute the disqualification on a selected scan out cycle.

Generally, one electronic scan control process form of the invention includes scanning data into scan chains of a functional integrated circuit via a decompression process, scan programming at least one mask qualification shift register via the decompression process, and masking the scan chains of the functional integrated circuit in response to the scan programming in the at least one mask qualification shift register, and holding such scan programming during scan-out of the scan chains thus masked.

Generally, and in a further form of the invention, an integrated circuit chip includes a functional circuit having scan chains, a decompressor having an input for compressed data and a decompressor output coupled to feed the scan chains, a compactor fed by the scan chains to provide a compactor output, and a selector circuit having inputs fed by the scan chains and an input for the compactor output, the selector circuit operable to couple the compactor output to a selector circuit output, the selector circuit also operable to instead couple a selected set of the scan chains to the selector circuit output, and wherein the selector circuit has a programmable register binary-decoded for select-control of the selector circuit to select such set of scan chains.

Generally, another electronic scan control process form of the invention includes decompressing input compressed data to feed scan chains, compacting at least some of the scan chains to provide a compactor output, and binary-decoding a programmable register to select a given set of scan chains for output, or selecting the compactor output instead.

Generally, a manufacturing process form of the invention associated with a design database and an original compressed pattern set earlier provided for debug of the design database, involves a process including: fabricating an actual unit of the integrated circuit based on the design database, and using the original compressed pattern set also as basis for production scan test of the fabricated actual unit of the integrated circuit.

Other scan circuitry, processes, circuits, devices and systems are also disclosed and claimed.

Figure 1:
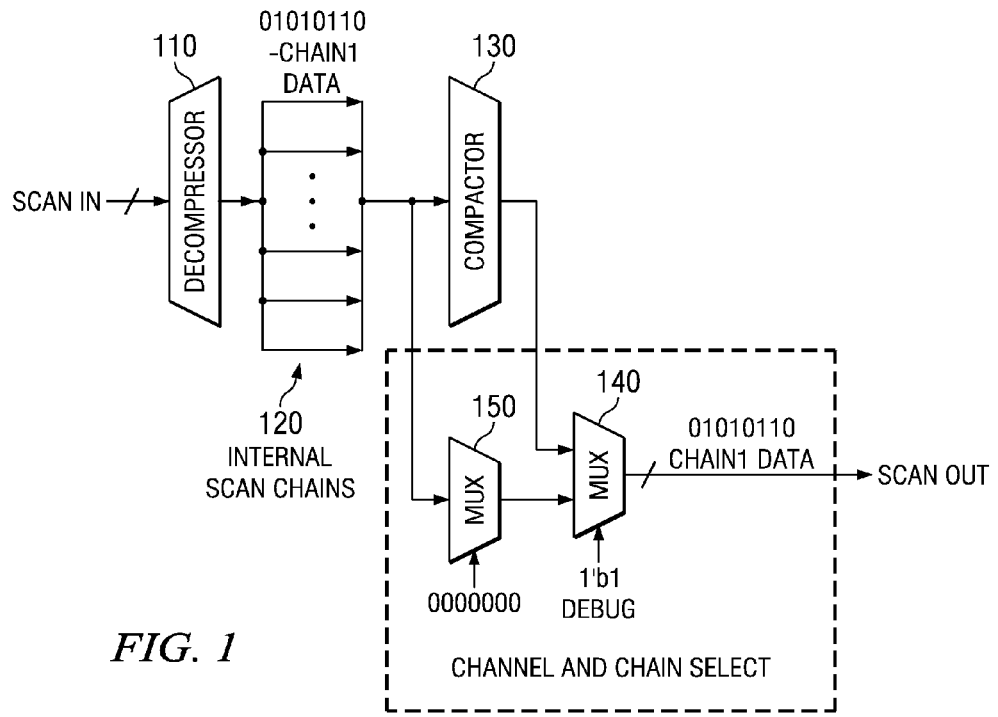
FIGS. 1 and 2 are each a block diagram of an inventive scan chain circuit performing respective operations.

Corresponding numerals in different Figures indicate corresponding parts except where the context indicates otherwise. A minor variation in capitalization or punctuation for the same thing does not necessarily indicate a different thing. A suffix .i or .j refers to any of several numerically suffixed elements having the same prefix.

DETAILED DESCRIPTION OF EMBODIMENTS

The inventive embodiments described hereinbelow address and solve the above-mentioned problems discussed in the Background, as well as other problems. They provide selective observability under user control of internal serial channels provided into a functional integrated circuit and that are scan chains called STUMPS. Such selective observability promotes ease of diagnostics as well as fault coverage recovery with reduced test time by including the output compactor for observing the selected set of internal scan chains, e.g. without, in some of the embodiments, resorting to a bypass mode bypassing the compactor.

This way, selection of a subset of set of scan chains, which are amenable for compaction (and disabling others that have a significant X content that in turn prevents meaningful compaction), is desirably enabled.

Embodiments of structure and process keep the original pattern set that was developed. By changing the setup/header content of the pattern set/tdl, each and every individual chain is separately observable. Various embodiments introduce control over observation of the internal scan chains through IR/DR of JTAG or P1500 and programmability of the chain/channel to observe, and bring out each chain for any given pattern easily. A Glossary is provided in TABLE 1.

Advantages include: The scan pattern set need not be regenerated—same patterns and only modifications in tester description language (as against modifications in patterns—and hence regeneration—themselves) delivered to product engineering can be used for debug, without need of creating bypass patterns (bypassing scan compression logic inside the DUT). Individual chains are easily observed. The same pattern set can be used and individual chains can be observed for the same pattern, so the paths/faults excited by the tool will remain the same. Any need to generate a Bypass pattern (bypass of scan compression logic inside the DUT) is avoided. Effort would otherwise be needed to generate these bypass patterns, verifying them and delivering them from the tester to the chip under test, and such effort is avoided herein. Verification of such bypass patterns takes a lot of simulation time for bigger designs as well.

New observability mechanisms for improved diagnostics and reduced test time with scan compression are provided.

Among other benefits, some embodiments improve upon earlier techniques in some or all the following ways, among others:

(a) Diagnostics of failing patterns can be carried out by translating a set of compressed ATPG patterns into an equivalent set of uncompacted patterns through pattern post-processing alone. A modified or constrained set of patterns is re-applied to the DUT through user programming of the JTAG/1500 test mode interface. There is no need to read these patterns into the ATPG tool again. Also, there is no need to generate additional patterns.

(b) Segregation or isolation of a specific set of internal scan chains corresponding to specific pattern sets is achieved by retaining the output compactor. This therefore retains the benefits of compression and hence reduces test time while still achieving the same coverage in spite of the need for segregation. Consider several motivating examples. These examples include the need to isolate a set of scan chains which have a large number of failing flip-flops due to gross process technology issues, (e.g. memory wrapper scan flip-flop issues in memories, etc.), or due to gross timing issues which result in the flip-flops capturing an unknown value, or having their shift values disturbed, (e.g. due to timing violations in the DUT's scan mode of operation). Segregation of internal scan chains having such flip-flops is necessary for efficient test pattern generation, since in its absence, such scan chains (with flip-flops having Xs instead of determinate values) will interfere (mask) the observability attainable through other scan chains with flip-flops capturing only determinate values.

(c) If the number of such scan chains required to be isolated is large, the same observability mechanisms can be configured instead to select a set of internal scan chains which now are to be observed (instead of being masked).

(d) Such forms of selective control can be enabled on a per ATPG run or a per ATPG pattern or a per pattern cycle basis, providing complete flexibility for the ATPG tool to choose between or anywhere in between the extremes of full compression and full bypass modes, mechanisms for which are believed to be neither supported in the scan compression architectures nor the corresponding ATPG tools offered by commercial vendor DFT solutions.

(e) The solutions proposed are scalable such that any combination of internal scan chains can be selected or a fixed set of such combinations are permitted. This flexibility is dependent upon the type of control hardware included for additional observability.

Improved diagnostics and reduced test times both benefit from the new observability techniques described here.

Figure 2:
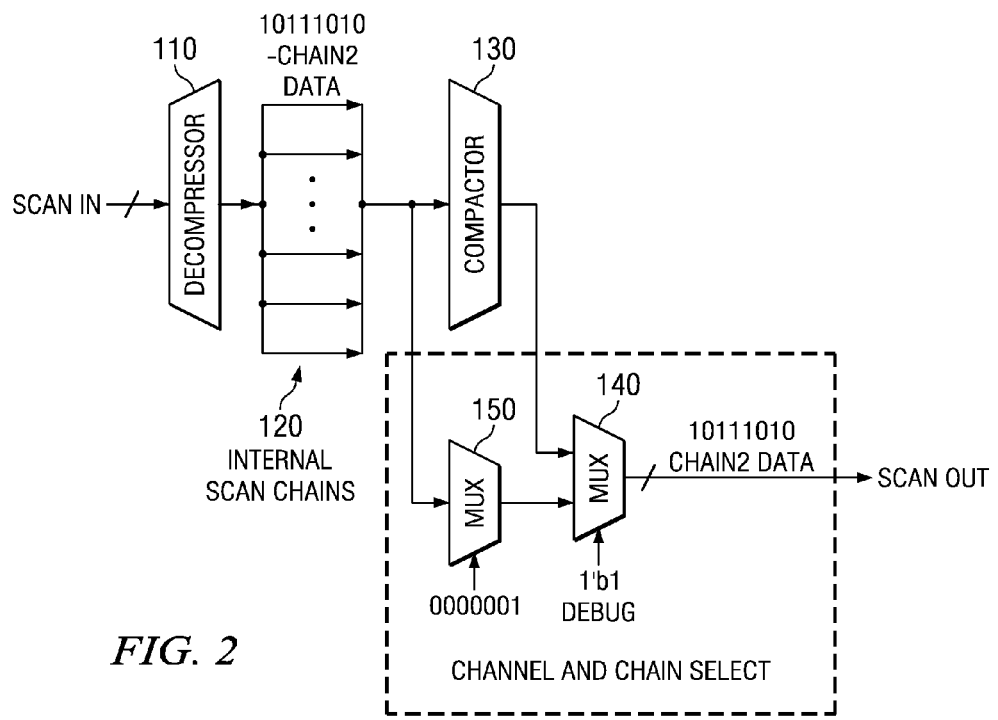
Figure 3:
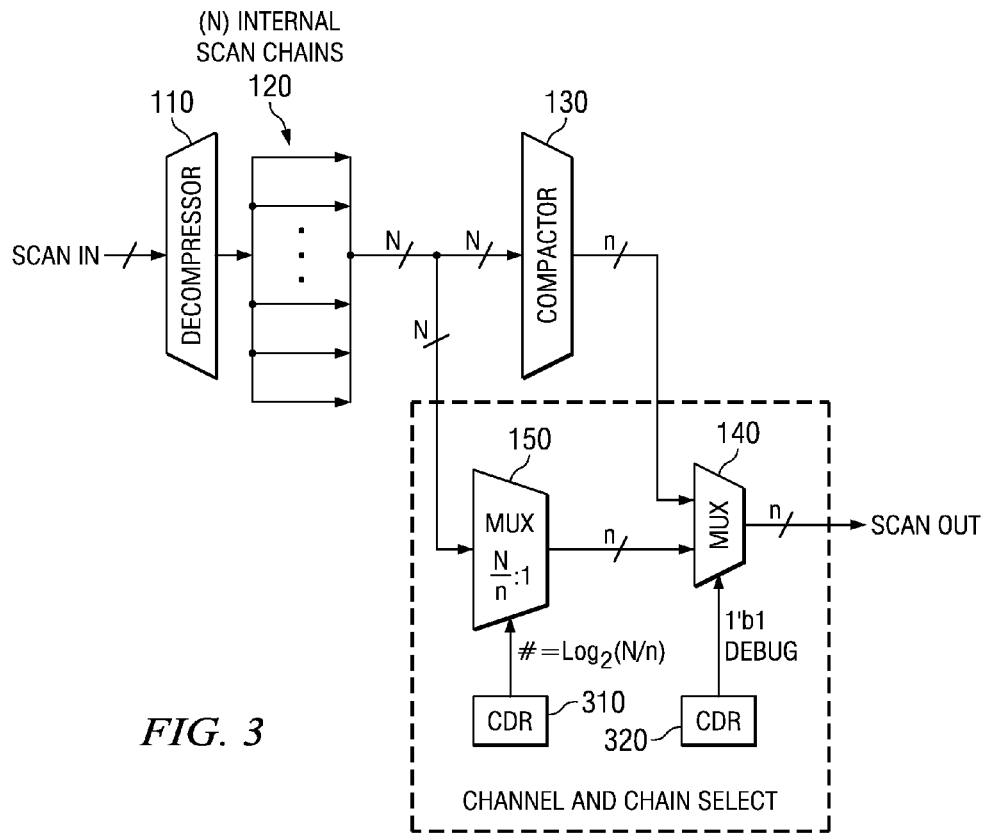
FIG. 3 is a block diagram of another inventive scan chain circuit.

In FIGS. 1-3, the structures and processes help to selectively propagate the internal scan chain contents onto the scan outputs without the compactor (thereby helping identify the failing flip-flops uniquely), with no additional support required from the ATPG tool. In a second category of embodiments of FIGS. 5-7, on the other hand, sets of internal scan chains are selectively propagated onto the scan outputs with the compactor in the loop. This helps reduce the test time as compared to a bypass mode of scan chain operation. In this case, an ATPG tool can exploit the programmability and availability in the observability mechanisms to selectively propagate the desired scan chains on either a per-pattern or per-cycle basis.

Remarkably, the various forms of selective control can be enabled on a per ATPG run or a per-ATPG-pattern or a per-pattern-cycle basis, providing complete flexibility for the ATPG tool to choose between the extremes of full compression and full bypass modes, mechanisms for which are believed to have been neither supported in the scan compression architectures nor the corresponding ATPG tools hitherto. Restrictions are obviated so that architectures and tools can go beyond pre-determined sets of scan chains (fixed by the scan compression architecture) and beyond fixed control for all the cycles in a given pattern set.

Some of the embodiments herein provide mechanisms that can be operated to replay a failing pattern applied iteratively N/n times. For each such iteration, n internal scan chains are directly observed, where n is the number of primary scan outputs and N is the number of internal scan chains. A number of accesses can be N divided by the number n of internal scan chains. No pattern re-generation is needed in this structural and process mode herein. Accordingly, regeneration, which may not guarantee the same internal state of the circuit for the failing pattern as for the iteratively applied pattern, has such risk obviated herein as well.

Some further advantages, among others, of various embodiments herein include:

(a) No regeneration of patterns for diagnostics.

(b) No re-load of patterns into the ATPG tool for diagnostics information on failing flip-flops.

(c) Same internal circuit state for diagnostics as that corresponding to the pattern failure.

(d) No need to resort to scan bypass mode ATPG patterns either for diagnostics or for internal scan chain isolation.

(e) Ability to select any combination of internal scan chains for observation or masking.

(f) Ability to select a reduced set of combinations (not fixed but with reduced programmability) with reduced observability mechanism control hardware.

(g) Ability to optionally include or exclude the compactor logic, thereby providing the right controls for targeting desired test data volume and test time compression as well as attaining desired diagnosability, independent of the amount of X-content in the DUT.

(h) Ability to interface this hardware to the ATPG tool to control the selection as well as masking/enabling feature on a per ATPG run, per ATPG pattern and per pattern cycle basis.

(i) De-coupling the ability for internal scan control from the available number of primary input pins, thereby providing better control and better compression.

(j) Ability to use constrained ATPG patterns (say, due to manufacturing and design conditions—with several masks across flip-flops and scan chains) normally applied for debug also for production test, without significant penalty since the output compactor is retained, (and without resorting to non-compressed scan bypass mode patterns).

TABLE 1

GLOSSARY

ATPG: Automatic Test Pattern Generation. Using vendor tools to generate patterns to check the quality of silicon during production. Generally refers to the stuck-at fault test pattern generation. Also can refer to $I_{DDQ}$ (static current into chip) and delay test pattern generation.
BIST: Built-In Self Test. Internal controller logic designed to apply stimulus to test a block of logic without applying test vectors (software). May refer to Memory BIST.
Bypass Pattern: Access from tester to internal scan chains inside DUT without CoDec logic, i.e. a pattern generated when CoDec is bypassed.
CDR/PI/scan-ff: Core Data Register/Primary Input/scan-flip-flop. Some embodiments replace with programmable register for test mode control.
CoDec: Compressor (Compactor) and Decompressor (forming the scan compression logic inside the DUT).
Compiled TDL: TDL compiled in tester language.
DFT: Design for Test.
DUT: Design Under Test
EDT: Embedded Deterministic Test.
IDDQ: Quiescent power supply current.
I/O: I = Input, O = Output.

TABLE 1-continued

GLOSSARY

IP core: Intellectual Property core (internal details not necessarily known to tester)
IR/DR: Instruction Register/Data Register.
JTAG: Joint Test Action Group, more commonly referring to the IEEE 1149.1 Standard, which defines the Test Access Port (TAP) and boundary scan design at the chip level.
Modular pattern -Setup pattern, VVS - Compiled Pattern in tester format
One-hot: Only one of the many will be selected.
One-hot decoder: Only one of the possible outputs of decoder will be selected.
PE: Product engineers
Scan: Structural test methodology that places the chip in a special scan state where virtually all functional flops are connected into one or more shift registers accessible to the tester, permitting test stimuli to be applied, and responses to be collected.
Setup/Header content: Control bits to configure the TAP controller (not the bits for the scan chain) or equivalent logic for test mode and ATPG setup.
SI/SO: Scan In/Scan Out
SOC: System on Chip
Spf: STIL protocol file.
STA: Static Timing Analysis
Static X in a flip-flop: Flop having constant unknown value content during scan operations.
STIL: Standard Test Interface Language, standard language for test patterns
STIL/TDL patterns: Standard Test Interface Language/Test Description Language patterns.
STUMPS: Self-Test Using MISR and PRPG Structures. Refers to internal smaller scan chains for scan-ins/scan-outs
TAP: Test Access Port. Defines I/O and state machine for test mode access.
Timing X: An unknown value X content due to a timing error.
TFT: Transition Fault Test: Generating patterns that can detect slow-to-rise and slow-to-fall faults.
VLCT: Very Low Cost Tester.
X-tol: Unknown value tolerance
X-content: X values, where X denotes neither Boolean '1' nor Boolean '0', i.e. unknown value content, e.g., in uninitialized storage cells, etc; or 'don't care' value can be either 1 or 0, or flip-flop is of no interest; non-deterministic state, or wrong (not-expected) state value.
1500: IEEE1500 standard for core based testing, similar to JTAG 1149.

Effective and efficient debug of compressed scan patterns has hitherto been problematic. Compressed scan chains can be difficult to debug both in simulations and in tester because for any given pattern the tool could have a number of internal scan chains getting compressed into the scan channel output.

In FIGS. 1-3, a first type of embodiment for compressed scan chain diagnosis uses an internal chain observation structure to solve this problem. The structure provides a multiplexer 150 in parallel to the compactor 130 of the on-chip scan compactor logic. Multiplexer 150 selects and controls which internal scan chain is observed at its output when an X-tol Mode is selected at a Multiplexer 140. The chain/channel selections in each of muxes 150 and 140 are flexibly controlled and achieved by programming Control Data Registers CDR 310 and 320 of FIG. 3 to provide the selections. Such registers can be established for purposes herein by allocating register fields in JTAG TAP (test access port) circuitry or analogous IEEE1500 circuitry of FIG. 8.

Also, circuitry at the input of compactor 130 coordinated with mux 150 in some embodiments is suitably provided to omit the outputs of scan chains selected by mux 150 from reaching the input of compactor 130. Let a test sequence initially feed compactor 130 with all N scan chains, and suppose the output of compactor 130 (e.g., n lines wide) fails to match a pre-determined pattern expected by the ATPG for all the scan chains thus compacted. Then internal bypass Mux 150 is applied with selections until the output of compactor 130 matches a pre-determined pattern expected by the ATPG for the remaining compacted scan chains. At that point, the scan outputs of Mux 150 can be expected with good probability to hold whatever unknown X's or problematic occurrences that call for further analysis at the tool or elsewhere in a testing system. In some other test process embodiments, the N scan chains are masked to divide them into sets of progressively-halved numbers in successive steps of the sequence. If the compactor 130 output of compactor 130 (e.g., n lines wide) in a given step matches a pre-determined pattern expected by the ATPG tool for all the scan chains thus compacted, the scan chains masked in that step probably hold the X's, else if the compactor fails to match then both sets of the scan chains (masked or unmasked) may hold X's. Then in the next step the masking is reduced by half on each set that may hold X's. In due course, the sequence identifies which set(s) of scan chains hold X's, and the flip-flop states in the scan chains in each such set are then individually compared with expected states to identify probable X flip-flops. Other systematic search sequences of any suitable deterministic or random type can be applied as well, or instead, to identify which scan chains are failing in the sense that they have one or more X values in them.

Note in FIG. 3, the real estate economy and time-efficiency represented by the small number $\log_2(N/n)$ of CDR bits binary-decoded to select-control the multiplexer to specify any particular one of N/n chain selections as well as the mux 150 circuitry to output the selected set of n chains. By contrast, to individually specify each of the selected n chains could take n $\log_2(N)$ CDR bits and involve a much greater and less-economical amount of mux 150 circuitry. In FIG. 3, the selector circuitry of some embodiments selects a number n of the scan chains out of all of said scan chains while the CDR has substantially $\log_2(N/n)$ bits to specify the number n of the scan chains for selection out of a total number N of said scan chains. That way, the programmable CDR can, in some of these embodiments even have fewer bits (i.e., $\log_2(N/n)$) for select-control of scan chains than the number n of selected scan chains. This occurs when $$n+\log_2(n)>\log_2(N) \tag{1}$$

For instance, with $N=1024=2^{10}$ total scan chains, Equation (1) is satisfied with a number as few as n=8 or more of selected scan chains. In the case of n=8, only 7 bits specify a given set of eight scan chains while, by contrast, individually addressing the scan chains would involve 80 bits (10-bit addresses times 8 scan chains). Associated addressing hardware that would be needed is dramatically reduced, and the time to program and operate the circuitry is shortened. Some other embodiments also have a counter circuit and byte-wide register fields to define range ends for the counter so that scan chains are progressively addressed set-by-set in sets of e.g. eight chains each, then the current set is scanned out serially eight-wide, and the counter advances to select the next set. A counting mode bit, when set, activates such counting circuit.

No need arises, as has apparently existed hitherto, for generating an uncompressed pattern using a particular tool nor to go through lengthy simulations for debug. No need arises for regenerating scan patterns, which implies or demands that the exact pattern set (or fault excitation) that caused the fault that is getting debugged be regenerated. Thus, the concomitant risk is obviated here, viz. that this exact pattern set will not be perfectly regenerated. If bypass patterns are generated using bypass logic in the DUT, the same fault could be observed, but it is not guaranteed that the other scan flip-flops are at the same identical state as in the compressed pattern.

In a process or method embodiment herein, tool based diagnostics are obviated. Moreover, as shown later hereinbelow, the process or method embodiments herein can offer or show better fault resolution than tool-based diagnostics.

Figure 4:
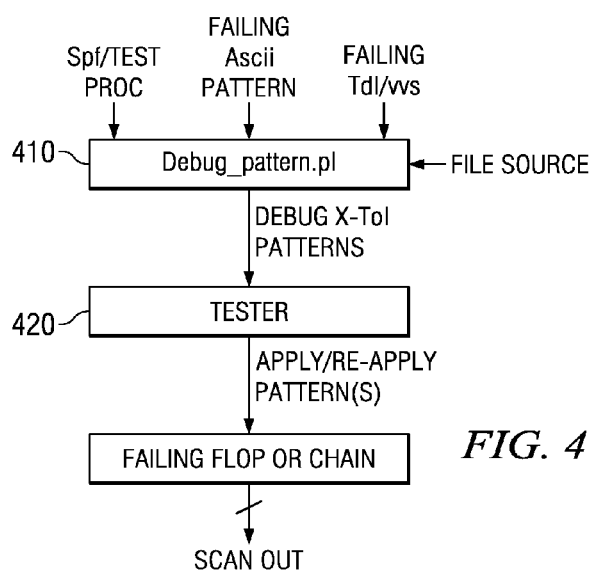
FIG. 4 is a block diagram of an inventively improved tester having inventive software called Debug_pattern.pl, the tester coupled to any of the circuits and systems of the other Figures.

The process embodiment in FIG. 4 remarkably uses the existing pattern set (ASCII and TDL) to create a new TDL with the internal chain data brought out in the scan out. It has minimal impact on area and almost no impact in timing since it is in the scan out path. It has no complications such as regeneration of patterns, setting up a new tool flow, relying on Product Engineering team providing data logs in a particular format, etc. The inputs suitably are the ASCII files, TDL, and the Fail log from VLCT that shows which scan channel and pattern is failing. The script takes care of copying the internal scan chain data that exists in an ASCII file onto the new TDL. For each failing pattern, the process creates a new TDL. All the internal chains are brought out to the top scan out pins, one set of scan chains (equal to the number of top level scan out pins) per pattern. The results can be handed off to Product Engineering swiftly. The first pattern set brings out the first set of internal scan chains to the scan output channels, the second pattern set brings out the second set of internal scan chains to the scan output channels, etc.

In FIG. 4, suppose scan pattern '1' is failing in scan channel '0'. Then, in effect, scan pattern number '1' is copied from ASCII onto TDL n times (where n is the number of internal Scan Chains for that particular Scan Channel), and the internal chain data are brought out one after the other in these new patterns in the new TDL. Since the data is being brought out from internal Scan Chains, and the processing compares them with expected data also corresponding to internal Scan Chains, the process can in effect narrow down on all failing flip-flops at one go or one pass. In case of tool based diagnostics, the process will identify a suspicious single flip-flop if possible or will identify a set of flip-flops as possible suspects in case more than one chain is getting compacted into the Scan Channel. Hence, the process or method embodiment gives better resolution without having to do tool based diagnosis. (See also description of FIGS. 10-11 later hereinbelow.)

The details of Scan Chain data being reflected or observed on a Scan Channel are illustrated in FIGS. 1 and 2, which show a structural embodiment to observe internal Scan Chains, which can be provided as a section of the solution or a modification to an existing scan compression solution. In FIG. 1, the structure and process are set or configured for observing 1st internal scan chain 120.1 at scan out. In FIG. 2, the structure and process are set or configured for observing a second internal scan chain 120.2 at scan out.

Integrated circuit manufacturers and their customers can benefit from use of these embodiments. Any work groups who use compressed ATPG patterns in their test suite can benefit from these embodiments of structure and process to achieve faster debug cycles. These embodiments help facilitate easier, swifter and more effective debug of patterns. The patterns are one-to-one compatible with the patterns delivered to Product Engineering function. Since, the scan testing structures on-chip are supposed to promote debug itself, the identification of any bugs in these scan testing structures should be swift and effective. These embodiments help narrow down on each failing scan flip-flop swiftly and effectively so that silicon debug focus can be on debugging other non-scan possible contributing reasons for silicon failure like STA (static timing analysis issue), IR (current-resistance) voltage drop, etc.

Conventional X-tolerant approaches have limitations. For example, in scan compression a large number of internal scan chains get compacted into fewer external scan outs, thereby reducing observability. Among other implications, this means that conventional scan compression impedes debug since resolution is poorer, and it impacts coverage since output is corrupted—due to Xs. Scan chains with X-content mask non-corrupted ones being observed on the same outputs. Compression is reduced since more patterns are required to overcome the just-mentioned poor resolution and corrupted output problems.

Various embodiments are provided for design and automation for compressed scan pattern diagnosis by using internal scan chain observation. Various embodiments, in the presence of scan compression, provide architectures for better debug, compression and X-handling. Debug capability is dramatically improved by identifying failing flip-flops using existing patterns without reading them back into ATPG tool and with no iterations. Conventional methods currently are believed to be very iterative, i.e., involve many iterations.

Various embodiments provide complete control (user selectable or tool selectable) to mask or observe any amount of X-content in internal scan chains. Current mask solutions are believed to operate coarsely (in gross) and inefficiently, which leads to coverage loss that in turn leads to pattern inflation.

The embodiments flexibly accommodate and utilize any compression tools familiar to the industry. Any of a variety of Compactor-Decompressor (CoDec) configurations can be used together with the observability and diagnosis process embodiments. For example, decompressor 110 suitably has any one or more of mux-decompression, XOR (exclusive-OR) decompression, or LFSR (linear feedback shift register) decompression, or other decompression technologies. Compactor 130 suitably has any one or more of XOR-tree compaction, MISR (Multiple Input Signature Register) compaction, or other compaction technologies.

In FIGS. 1, 2 and 3, an architecture diagram depicts an embodiment for debug of compressed patterns.

In FIG. 3, the internal scan chain selection and debug bit are controlled using IEEE1500 controller CDR bits (WS_USER_DMLED_TESTID)

In FIG. 4, a process diagram depicts a flow for preparing or generating patterns that accommodate X-content and uses the circuit of FIG. 3, for instance. In FIG. 4, a flow diagram for debug pattern generation shows four file sources of inputs for 1) Spf/testproc, 2) Failing ASCII pattern, 3) Failing TDL/VVS. A fourth file source provides a file containing information of the mapping of failing patterns to failing scan chains (scan flip-flops) on a per pattern (per cycle) basis. For one example of implementation, a software script is suitably written in practicing some versions of the process embodiment of FIG. 4 for copying or converting the ASCII data for internal Scan Chain to TDL (test description language of the tester) as Scan Channel data. The failing pattern, original ASCII file, testproc/spf file, etc., are used as inputs to a PERL script. The PERL script takes the failing log and the failing pattern information and generates debug patterns by bringing out each internal scan chain out to the scan channels. So, if 128 internal scan chains are compacted into 4 external scan channels, for a failing pattern 128 new debug patterns can be generated such that each internal scan chain is brought out to the top-level scan channel. Some other process embodiments alternatively generate 128/4=32 debug patterns and 32 accesses to obtain four internal scan chains at a time through the four external scan channels. Other numerical examples can readily be devised also.

Figure 6:
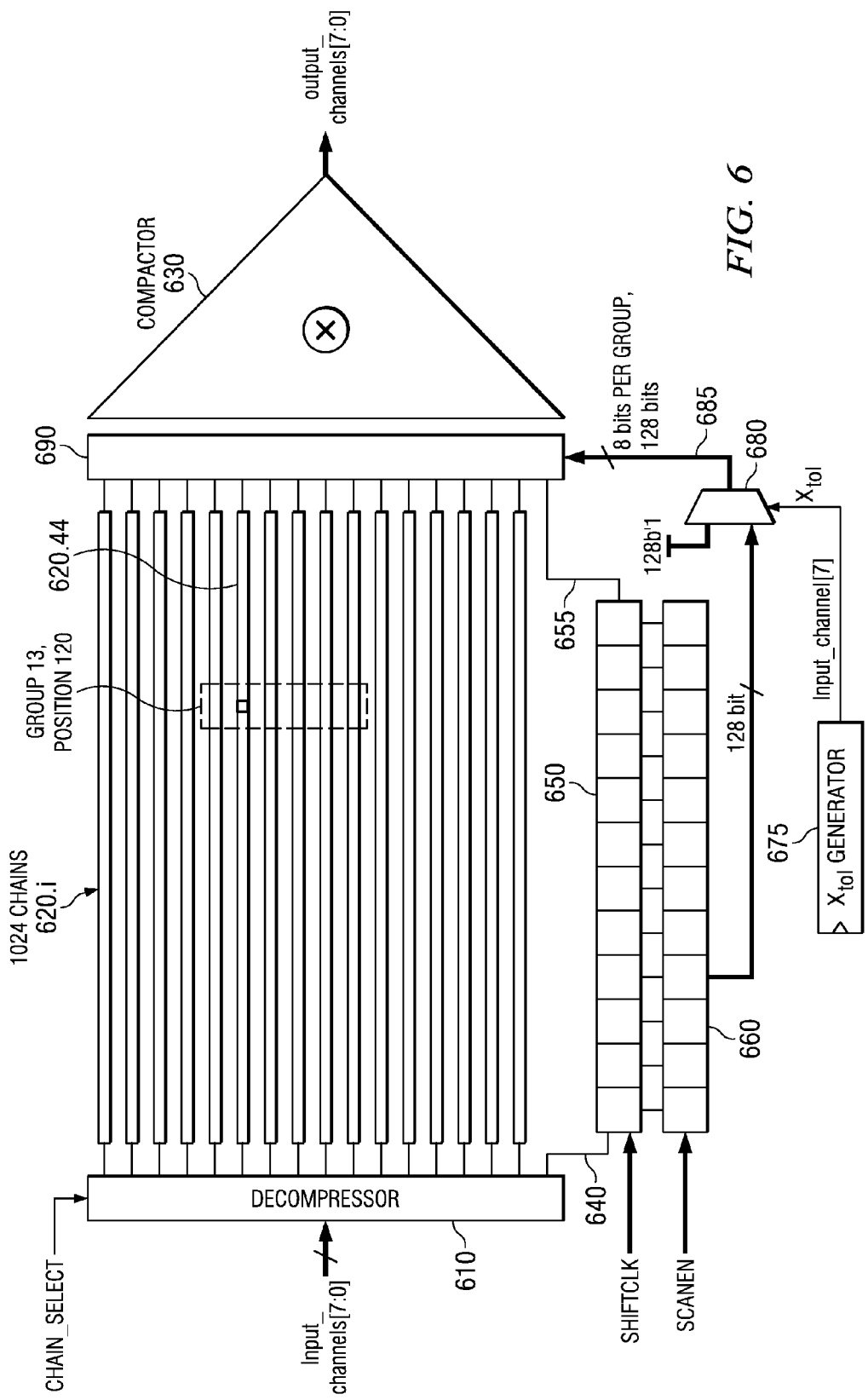
FIG. 6 a block diagram of another inventive scan chain circuit called X-Tol Arch-2 here.
Figure 7:
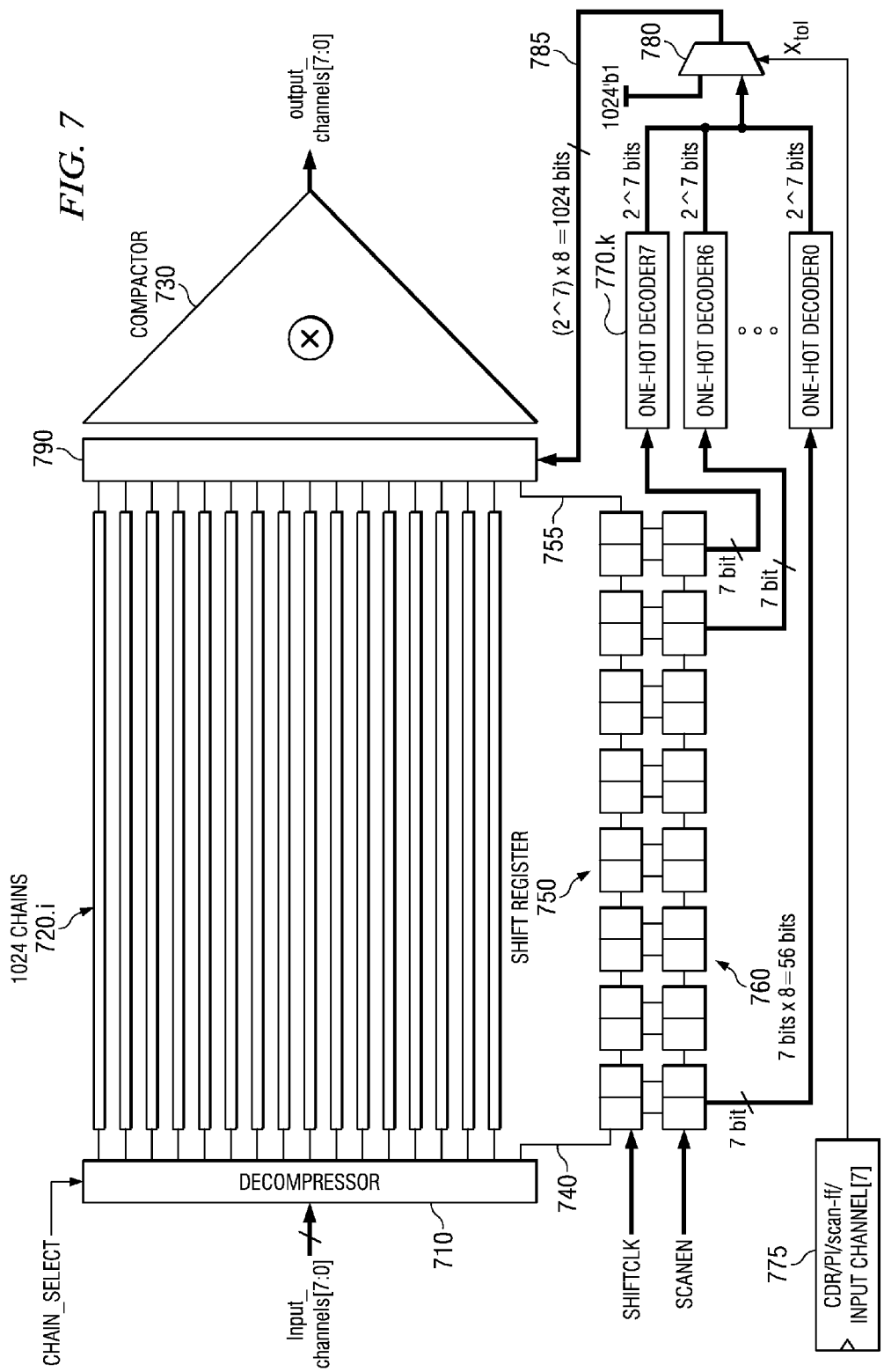
FIG. 7 is a block diagram of another inventive scan chain circuit called X-Tol Arch-3 here.
Figure 8:
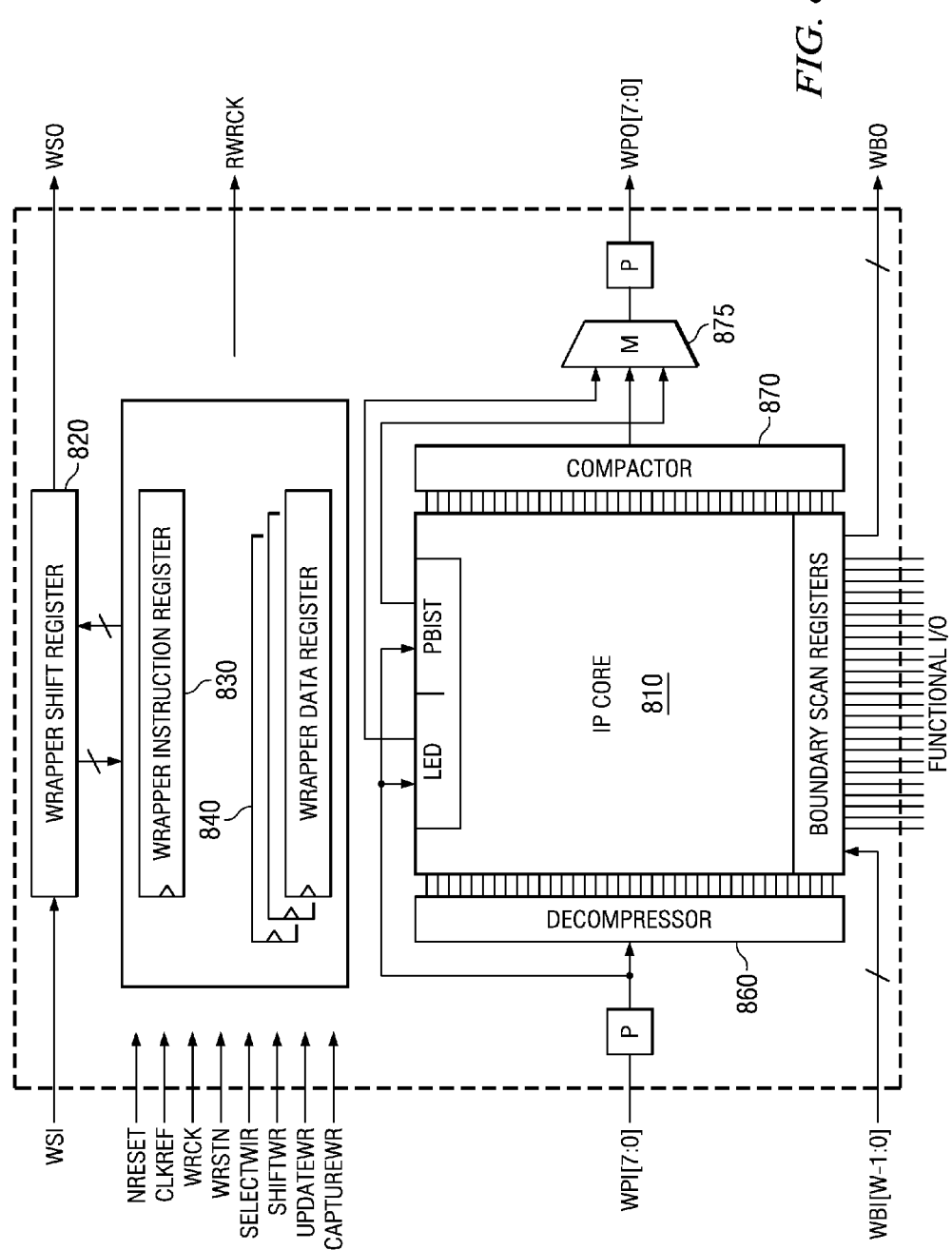
FIG. 8 is a block diagram of another inventive scan chain circuit improved as shown in the other Figures and coupled with a scan interface.

Some further embodiments combine and/or replicate any one or more of the embodiments in FIGS. 1-3 and FIGS. 5-7 and mux their inputs and outputs to scan interface circuitry such as IEEE 1500 of FIG. 8.

Figure 5:
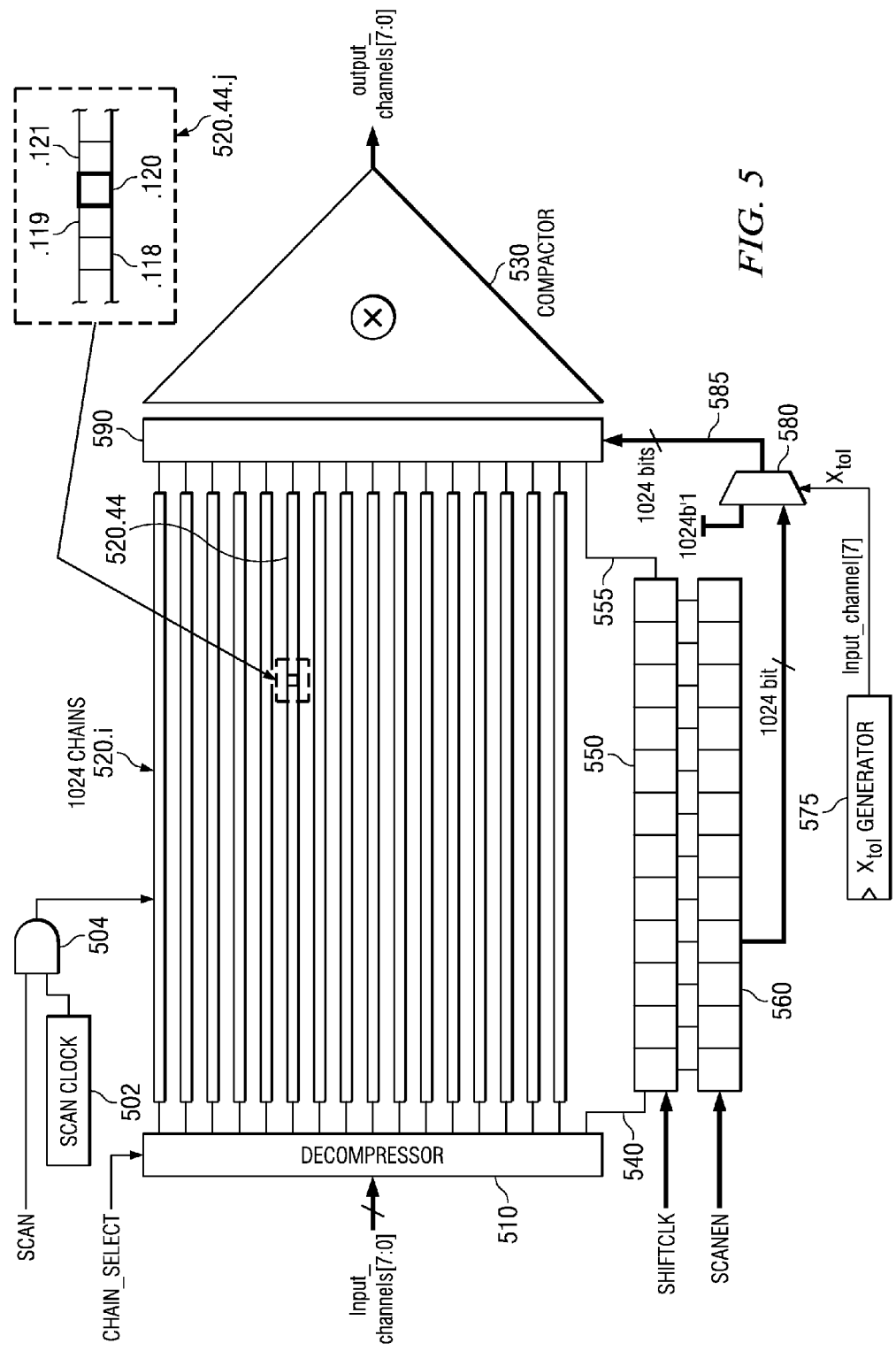
FIG. 5 is a block diagram of another inventive scan chain circuit called X-Tol Arch-1 here.
Figure 6A:
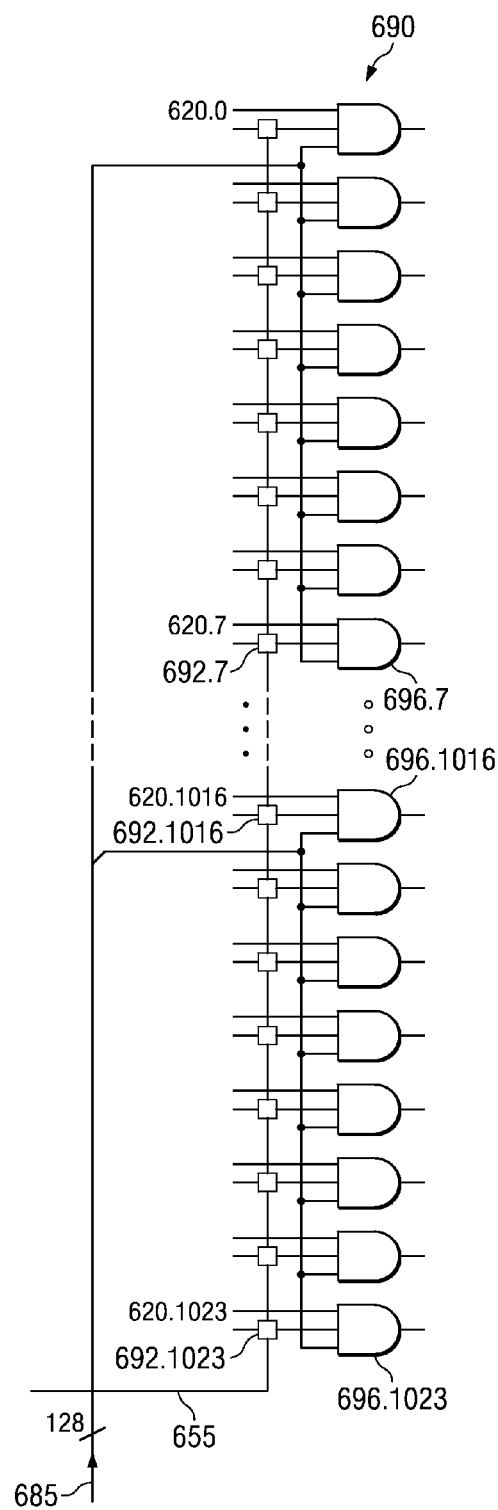
FIG. 6A is a partially-block, partially-schematic diagram of a second form of inventive masking circuit, this circuit for use in FIG. 6.

In FIGS. 5, 6 and 7, some embodiments provide observability through the compactor, resulting in higher compression to compensate or reduce pattern inflation. These remarkable observability mechanisms are incorporated into scan compression architectures for improved diagnostics and reduced test time. Herein, they interface with ATPG tools to provide for selective internal scan chain control (isolation or enabling) for better debug/diagnostics, and better ability to handle X-content in scan flip-flops. The output compactor structure and function are valuably retained and utilized. It is unnecessary to resort to a scan bypass ATPG mode.

In FIG. 5, an embodiment X-Tol Arch-1 provides better debug/compression. A scan clock 502 is coupled via an AND-gate 504 when enabled by a Scan control signal to scan information into and out of scan chains 520.i provided as testability structures in a functional integrated circuit. Decompressor 510 has a large demux to route scan bits from tester/emulator channels 420 to internal chains 520.i. The embodiments flexibly accommodate and are independent of industry standard compression tools. The chains 520.i are clocked by scan clock to bring the image bits out to the Compactor 530. The Compactor 530 has a multi-stage XOR Tree (circle-(X)). 1024 register cells in register 560 for 1024 STUMPS (mask code registers) provide observability and maskability for each STUMP. In this FIG. 5 architecture, N internal scan STUMPS use N shift register cells in register 550 and N data register cells in register 560, where N=1024 in this embodiment. Consider an, e.g., 8-wide XOR compactor output, where the compactor 530 is organized in eight segments to provide the 8-wide compactor output labeled output_channels[7:0]. Scan out up to eight (8) individual STUMPS at a time, with each STUMP situated in a different set of 1024/8=128 scan chains. Respectively scan each of the eight STUMPS out through a corresponding one of the eight compactor 530 segments respectively. Doing so does not compact the eight STUMPS with each other and thereby provides STUMP-individualized scan outputs without any bypass mux hardware.

Figure 5A:
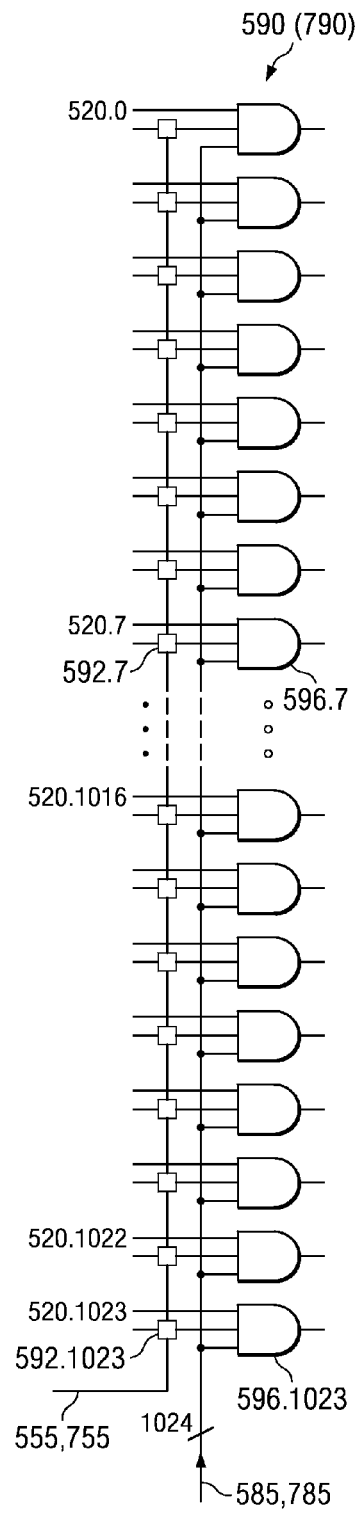
FIG. 5A is a partially-block, partially-schematic diagram of an inventive masking circuit for use in FIGS. 5 and 7.

In FIG. 5A, 1024 mask code registers 592.i are in mask code circuitry 590 for 1024 STUMPS 520.i. In the mask code circuitry 590, a set of 1024 three-input AND-gates 596.i together with the mask code registers 592.i provide observability and maskability for each STUMP. In FIG. 5, a line designated Input channel[7] is any of CDR/PI/scan-ff and controls the 2:1 selector input of a Mux 580 (2×1024:1× 1024). A 1024-wide output line 585 from Mux 580 has individual lines 585.i that respectively qualify or disqualify each AND-gate 596.i in FIG. 5A. Some embodiments omit the registers 592.i.

In FIG. 5, operation of the embodiment architecture is described below:

1. While scanning data in the design DUT (e.g., 810 of FIG. 8), mask shift registers 550 (and 592.i when included) are also programmed using decompressor 510 because shift register chain 540, 550, 555, 592.i is also treated or assumed by FIG. 4 process 410 at tester 420 as one of the scan chains. The scannable masking qualification circuit 550, 560, 580 is thus programmable by scan-in of bits by decompressor 510 along with scan-in of the scan chains 520.i. Values are shifted-in under control of process 410 on tester 420 based on the previously-discovered X-content of the chain. For example, if FIG. 5 chain 520.44 has some X content and should be blocked, then shift_reg_44 (550.44) is shift-loaded with '0' as part of and by the end of the shift-in process. All other shift register cells 550.i are illustratively loaded with '1' as part of and by the end of shift.

When scan enable signal 'scanen' changes state, shift register 550 data is loaded into data registers 560. In this way, the scannable masking qualification circuit 550, 560, 580 locks in such scanned-in bits and holds those bits upon scan-out of scan chains 520.i as they scan out through mask code circuitry 590. The bits in register 560 remain in place while information is scanned out of scan chains 520.i and thus the scannable masking qualification circuitry 550, 560, 580 is at least partially isolated from control by the scan-out circuit 502, 504 on scan-out. On scan out, some embodiments also do scan out the bits in register 550 to the compactor 530 and thereby include the bits in register 550 in the compacted pattern and confirm that those bits were decompressed by decompressor 510 and scanned in. Thus in the latter embodiments, the compactor 530 is also fed by register 550 for compaction of such scanned-in programming bits upon scan-out while register 560 holds such scanned-in programming bits.

2. Data register values 560 are muxed by mux 580 and provided to blocking (AND) logic 596.i of FIG. 5A. The Mux 580 selector input is called X-tol enable, which selects whether X-tolerance is used or not. X-tol enable can be controlled through top level pin or a core data register CDR or automatically by FIG. 5B Xtol generator 575, which acts as a control signal generator operable to supply a varying control signal to modulate the masking qualification circuit on various scan out cycles to qualify and disqualify one or more scan chains 520.i.

3. While shifting out, if there is an X content in a particular shift position, X-tol enable can be set to '1' for that shift cycle. If Chain 520.44 has an unknown X at shift position j=0.120 (520.44.120), see FIG. 5 inset, then data_reg_44 (560.44) will be loaded with '0', and for the $120^{th}$ cycle X-tol enable will be set to '1'.

Figure 5B:
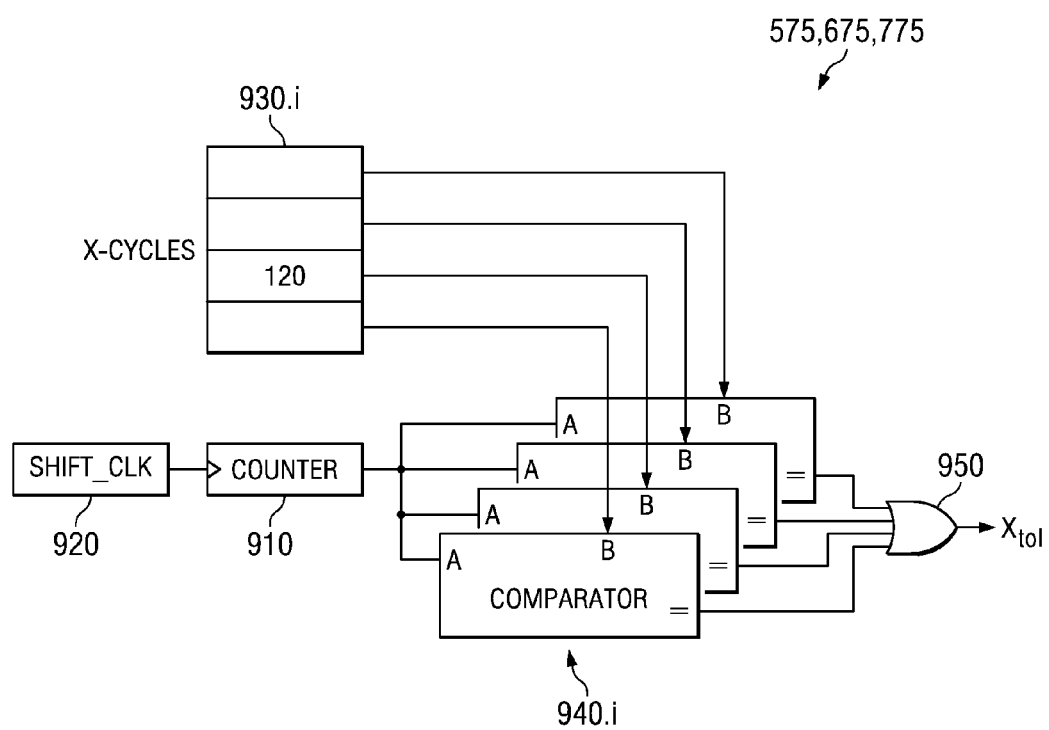
FIG. 5B is a partially-block, partially-schematic diagram of an inventive control circuit called an Xtol generator here, for use in FIGS. 5, 6, and 7.

In FIG. 5B, a detail of Xtol generator circuitry 575 and its operations control that illustrative $120^{th}$ cycle of scan out. A counter 910 clocked by Shift clock 920 counts the cycles of scan out and feeds the count to a comparison input A of each of, e.g. four, comparators 940.i. Several scan-configurable registers 930.i can hold one or more position values of position j, typified by j=120 along chain 520. Registers 930.i couple the position values stored therein respectively to corresponding B inputs of the comparators 940.i. A multi-input OR-gate 950 supplies active Xtol output from Xtol generator circuitry 575 when any of the comparators 940.i detects a match (making equal "=" output active). In FIG. 5, mux 580 ordinarily provides universal qualification 1024b1 to the FIG. 5A AND-gates 596.i so that they mask on the basis of whatever mask the tester has shifted into and provided to the mask registers 592.i. However, on one or more cycles (if any) for which an unknown X is to be masked (e.g., cycle 120), mux 580 responds to Xtol generator circuitry 575 and passes 1024 control signals from data register 560.i through mux 580 and to the respective qualification input of each AND-gate 596.i. Given that Chain 520.44 is to be masked at cycle 120, Xtol enable is activated at cycle 120, and a masking zero from register 560.44 is fed to disqualify AND-gate 596.44 from passing the unknown X from chain cell 520.44.120 to compactor 530 on cycle 120.

Note also, that by differently loading shift register cells 592.i and shift register cells 550.i, a variety of synergistic scan-out patterns can be obtained using X-tol modulation, i.e. ability to control the X-content that is blocked or passed. One example of operation loads shift register cells 592.i to apply zeroes (0) to mask all of the scan chains 520.i except for a particular set of them for which ones (1) are applied. Concurrently, shift register cells 550.i have been loaded to apply zeroes (0) to mask one or more of that particular set of scan chains when X-tol is active on a given cycle. This way, when X-tol is inactive, the 1024b1 universal qualification is selectively prevented by shift register cells 592.*i* from qualifying all the scan chains 520.*i* for compaction by compactor 530. Some other embodiments also provide modes wherein the logic represented by AND-gates 596.*i* is made mode-dependent so as to provide various Boolean minterms or composite logic functions involving AND, OR, and NOT and other logic circuit equivalents. In some embodiments, the operation is set up reversely or additionally, wherein mux 580 has 1024b0 universal disqualification zero inputs that disqualify all AND-gates 596.*i* unless a masking one (1) is fed from a given register, e.g., 560.44. Still other embodiments replace the 1024b1 or 1024b0 with the shift register cells 592.*i* outputs themselves. Some other embodiments save real estate by also providing a few mode bits (e.g., 2 or 3 of them) to additional selector lines of mux 580 to select between several hardwired mux 580 inputs provided with additional values analogous to 1024b1 or 1024b0 but that can mask off various sets of scan chains, or all but such various sets. By various embodiments, the remarkable operations effectively modulate, switch or substitute distinct masks depending on the state of X-tol. Some embodiments omit shift register 560 (and the like in FIGS. 5-7) and feed the mux 580 directly from shift register 550, and connect mux 580 to an input 1024b0 while scanning-in register 550.

Benefits of the FIGS. 5, 5A, 5B embodiment include, among other things, that it provides observability of each STUMP at top-level scan outs. Xtol generator circuitry 575 together with mux 580 and AND-gates 596.*i* can provide per-cycle shift cycle masking. If there is a static X in a flip-flop 520.*i.j*, only in that shift position j is the X-Tol mode enabled. Only part of a pattern remains uncompressed. No limitation on number of STUMPS, nor any grouping limitation, is imposed. Compactor 530 is not bypassed in X-Tol mode, hence the embodiment provides better compression in presence of Xs. This FIG. 5 embodiment is useful when extra registers (2N, e.g., 2048) are acceptable from a real-estate viewpoint. One of the scan-ins is used as X-Tol enable and acceptably increases scan-in pattern bits a little.

In FIG. 6, another embodiment X-Tol Arch-2 provides better debug/compression as follows. Decompressor 610 has a large demux to route scan bits from tester/emulator 420 channels to internal shorter chains 620.*i*. The chains 620.*i* are clocked by scan clock to bring the image bits out to the Compactor 630. The Compactor 630 has a multi-stage XOR Tree. As regards compactors 130, 530, 630, 730 herein, other types of compactor circuits may also be used instead or in combination.

In FIG. 6A, 1024 mask code registers 692.*i* for 1024 STUMPS provide observability and maskability for each STUMP 620.*i*. Some embodiments provide fewer mask code registers 692.*k* than the number N of STUMPS to mask off the scan chains 620.*i* in sets k. In some embodiments, these registers 692.*k* are connected to sets k of the AND-gates 696.*i* and arranged to independently mask or not mask the same sets k of the scan chains as those defined by the wiring of lines 685.*k* to AND-gates 696.*i*. In some other embodiments, these registers 692.*k* are arranged to independently mask or not mask sets of the scan chains that are different sets from and/or overlap with those sets defined by the wiring of lines 685.*k* to AND-gates 696.*i*.

In the FIG. 6 embodiment, N internal scan STUMPS 620.*i* are grouped in (N/n) groups where n=Top level output_channels (in above figure assume N=1024, n=8, so total number of groups=128). Each group has n stumps, 128 register cells in shift register 660 for 1024 STUMPS. Mask code circuit 690 in FIG. 6A provides observability and maskability for each group of 8 STUMPS. Mux 680 is fed an Xtol enable from an Input Channel, such as CDR/PI/scan-ff. In this embodiment, masking ability and observability are provided for every group (instead of every STUMP as in FIG. 5). Hence every group 0<=k<=127 has a shift register cell 650.*k* and data register cell 660.*k* to support and qualify or disqualify the corresponding masking circuit group 690.*k* having FIG. 6A mask control logic 690.0-.7, 690.8-0.15, . . . 690.1016-.1023, where i/8=k. So for 1024 internal STUMPS and 8 external output_channels, i.e. [7:0], 128 groups and hence 128 shift registers 650.*i* and 128 data registers 660.*i* are provided. Thus, shift register 660 includes a set of shift register cells, and each cell 660.*k* in the set is operable to select a corresponding plurality of scan chains 620.*i* corresponding to such cell 660.*k* for qualification or disqualification of that plurality of scan chains in tandem.

Operation of the FIG. 6 embodiment is described next:
1. While scanning data into the design DUT 810, mask shift registers 692.*i* are also programmed using decompressor 610, since the shift register chain 640, 650, 655, 692 is also treated or assumed by process 410 on tester 420 as one of the scan chains. Values are shifted in based on the X-content of each chain 620.*i* and its group k=i/n. For example, if chain 620.44 has some X content and it is in group 5 (k=44/8), then all the 8 chains of group 5 are blocked in order to block chain 620.44. For this, shift_reg_5 (650.5) is loaded with '0' as part of and by the end of shift-in. All other shift registers 650.*i* are illustratively loaded with '1' as part of and by the end of shift-in.
2. When scan enable signal scanen changes state, shift register 650 data is loaded into data registers 660. The data register 660 values are muxed by mux 680 and provided to blocking (AND) logic. Mux selector is called X-tol enable, which selects whether X-tolerance is used or not. X-tol enable is controlled through a top level pin or a core data register CDR or by Xtol generator 675 as described in FIG. 5B.
3. While shifting out if there is an X content in a particular shift position, X-tol enable is set to '1' for that shift cycle. If chain 620.44 (group 5) has an unknown X at shift position 120 then data_reg_5 (660.13) is loaded with '0' and on the $120^{th}$ cycle X-tol enable is set to '1'. On that $120^{th}$ cycle, chain 620.44 along with the other chains in its 8-chain group has output masked by AND-gates 695.40-.47 in FIG. 6A masking circuit 690.

Advantages of the FIG. 6 embodiment include, among other things, that it provides observability of each STUMP at top-level scan outs. It provides per-cycle shift cycle masking. If there is a static X in a flip-flop, only in that shift position is the X-Tol mode enabled. Only part of a pattern remains uncompressed. No limitation on number of STUMPS is imposed. This FIG. 6 embodiment does not bypass Compactor 630 in X-Tol mode. If there is X-content in a chain, only the particular 8 chains of that group are blocked in tandem and all other groups are or can be compacted. This FIG. 6 embodiment thus still provides better compression than traditional one-hot decoder based architecture. This embodiment also has less area overhead compared to the embodiment of FIG. 5 because fewer registers 650.*i*, 660.*i* are used.

This FIG. 6 embodiment uses 2N/n additional register cells in shift registers 650, 660 and is useful when fewer (e.g., 256) additional registers are preferred than in FIG. 5. A scan-in line Input channel[7] is used as X-Tol enable, which represents an acceptably small increase in scan-in pattern bits. Scan chains are grouped in X-Tol mode. If one chain is masked, the other chains (e.g. 7) of that group k are also masked in X-Tol mode.

Additional mixed embodiments can be prepared, such as ones combining the masked compaction of FIG. 6 with the bypass mux circuit 150 of FIG. 3. In some embodiments, the circuitry of the compactor 630 is optimized and operated in response to an additional CDR mode bit so that when some of the compactor 630 is masked, then the logic circuits in the compactor 630 are re-used to simultaneously perform and deliver a bypass mux output for the masked portion. Some other embodiments simply have a mode bit to invert the entire mask at masking circuit 690 and the outputs of masking circuit from that set k are hardwired to the inputs respectively for the n compactor 630 segments. The selected set k of scan-chains is thereby scanned out through the compactor 630 effectively uncompacted after determining in steps 1-3 hereinabove that compaction of all scan chains except for that set provides the compacted output expected from proper functioning.

In FIG. 7, another embodiment X-Tol Arch-3 for better debug/compression has a line 740 that carries signals from Decompressor 710 to Shift Register 750. The signals are controlled dynamically per-cycle or statically per-pattern under External control or decompressor 710 output. Shift register 750 is parallel coupled to data register 760. Data register 760 provides a 7 bit register 760.k for each group k of STUMPS, and thereby provides observability of any 8 STUMPS across the groups. (The multi-bit nature of each of the n registers 750.k and 760.k is represented in FIG. 7 by a center bar inside each register box.)

Each one-hot decoder 770.k provides a decoder circuit based on binary decoding of input signals, 0<=k<=7. A particular 128-bit binary signal at the $2^7$=128-bit-wide output of the decoder 770.k is generated by the decode circuit in decoder 770.k in response to 7 bits from the corresponding data register 760.k. Notice that shift register 760 has 8 sets of 7 bits each. In response to each of these eight sets a 7-to-$2^7$ bit decoder 770.k provides 128 bits ($2^7$) as output. Eight such outputs from the eight decoders 770.k together form, or are concatenated to form, 1024 bits and fed to mux 780. Mux 780 responds to a one or zero selector input Xtol, such as from any of a CDR, PI, scan flip-flop, or Input Channel[7] from Xtol generator 775 to select either 1024 one-bits (1024b'1) or the 1024 bits from the eight decoders 770.k. Some other embodiments augment the 1024b' 1 input with other hardwired mux 780 inputs or with shift register-based circuits analogous to the discussion of various embodiments related to X-tol controlled mask switching in FIG. 5.

In this FIG. 7 embodiment, N internal scan STUMPS are grouped in n groups, where n=top level output channels (in above figure assume N=1024, n=8, so total number of groups=8). Each group has (N/n=128) STUMPS. A 7-bit register for each group of STUMPS provides observability of any one STUMP in a group k, and of any 8 STUMPS across the groups. In this embodiment, masking ability and observability are provided for any n chains (e.g., 8) across the groups. In X-tolerance mode, only 1 STUMP is observed in one group and any combination of STUMPS across groups can be observed. For example, suppose there are 8 groups and each group has 128 STUMPS. Group1 has (0-127), Group2 (128-255) . . . Group8 (896-1023). Hitherto, grouping limitations have existed. For example, if chain 0 is to be observed on channel 1, only a specific combination of STUMPS could hitherto be observed on other output channels (0,128,256 . . . 896). But with the FIG. 7 architecture, the grouping limitation is overcome and eliminated. For example, if chain 0 is to be observed on channel 1, then on other channels any combination of STUMPS can be observed ([any one of [128-255], any one of [256-383] . . . , any one of [896-1023]). With an, e.g., 8-wide XOR compactor output, scanning out up to eight (8) individual STUMPS, one in each 128-wide set of STUMPS, is readily accomplished directly through the compactor 730 without any bypass mux whatever. Introducing control registers 760.k for every group k provides this flexibility, and introduces $\log_2(N/n)$ shift register bits and data register bits per group. Hence, a total (n*$\log_2(N/n)$=56) shift and data registers are used.

Operational flow is described below:

1. While scanning data into the design DUT 810, FIG. 5A mask shift registers 592.i are also programmed using decompressor 710 since the shift register chain 740, 750, 755, 592 is also treated or assumed by process 410 on tester 420 as one of the scan chains. Values are shifted in based on the X-content of the chain and its group. For instance, if chains i=[0,144,273,425,611,754,895,922] are to be observed, then shift register 750 (shift_reg[0-55]) is loaded with the following values that then go to data register 760. The values in data register 760 are equal to the binary difference of each hypothetical chain number i less the base value 128k for the group 0<=k<=7 in which that chain number lies. [0000000_0010000_0010001_0101001_1100011_1110010_1111111_0011010].

2. When scan enable signal scanen changes state, shift register 750 data is loaded into data registers 760. Data register 760.k values are one-hot decoded by decoders 770.k and provided via 1024 mux 780 output lines 785 to FIG. 5A blocking (AND) logic 596.i. The Mux 780 selector line is designated Xtol enable, which selects whether X-tolerance is used or not. Xtol enable is suitably controlled, such as through a top level pin or a core data register CDR or by Xtol generator 775 as described in FIG. 5B.

3. While shifting out, if there is an X content in a particular shift position then X-tol enable is set to '1' to select the one-hot decoders 770 for that shift cycle. Suppose Chain 44 (group 0=44/128) has an unknown X at shift position 120. Then for the 120$^{th}$ cycle X-tol enable is set to '1'. Data register 760 is appropriately loaded with 56 bits that are decoded by one-hot decoders 770 to generate all ones except for a zero to disqualify FIG. 5B AND-gate 596.44 in FIG. 7 mask circuitry 790. Any chain other than chain 44 can be observed from group 0 at top-level output_channels.

Advantages of the FIG. 7 embodiment include, among other things, that it provides observability of each of n independently-specified STUMPS at top-level scan outs. It provides per-cycle shift cycle masking. If there is a static X in a flip-flop at chain i shift position j, then only in that shift position j will X-Tol mode be enabled. Only part of an entire scan pattern or bit-image in the functional integrated circuit will remain uncompressed. No limitation on number of STUMPS is imposed. No grouping limitation exists either.

That way, if the compacted output is as expected by using compactor 730 to compact all chains 720.i except those selected in step 1, then that output provides evidence that the failing chain(s) are indeed among those chains selected in step 1. These chains themselves are then suitably scanned out in parallel through compactor 730 in effect as eight individual effectively uncompacted outputs by inverting the mask at mask circuit 790 such as by an invert-control (all-but) input to all the AND-gates 596.i in FIG. 5B. Alternatively, a universal disqualification input 1024b0 is provided as an input to mux 780, and X-tol enable causes mux 780 to select the 1024b0 input at each position of an unknown X. The one-hot decoders 770 are arranged to generate all zeroes except for a one (1) to qualify FIG. 5B AND-gate 596.44 in FIG. 7 mask circuitry 790 and likewise for each one of eight selected scan chains to be scanned out for further analysis.

This FIG. 7 embodiment uses n*log₂(N/n) register cells 760, and is useful when only a relatively few (e.g., 2×56) additional registers with their decoding logic 770 are acceptable. One of the scan-in lines is used as X-Tol enable, which is an acceptable increase in scan-in pattern bits. Compressor 730 is partly masked in X-Tol mode. Masking shift register 592 can be set to mask one complete chain 720.$i$ if it needs to be masked for production patterns.

Variants of the FIG. 7 embodiment use different numbers n of groups. The number of decoders 770.$k$ is equal to the number n of groups. The number of registers in a register 760 is equal to n*log₂(N/n)=n*(10−log₂(n)) when N=1024. TABLE 2 shows the parameters of some of these embodiments. An embodiment is selected by considering 1) the probability that more than one chain in a same group may have an unknown, 2) the amount of additional decoding logic given number n and the internal complexity of the decode in each decoder from TABLE 2 value m to $2^m$, and the number of additional register cells 2 n m.

TABLE 2

NUMBERS OF DECODERS AND REGISTER CELLS*

| n | m = (10 − log₂(n)) | Register cells nm |
|---|---|---|
| 4 | 8 | 32 |
| 8 | 7 | 56 |
| 16 | 6 | 96 |
| 32 | 5 | 160 |

*when chains N = 1024.

As TABLE 2 indicates, by choosing the right number of decoders and register cells, a variety of intermediate solutions are possible with this scheme, wherein the X-tol modulation control can be used for selecting individual or groups of internal STUMPS channels (with varying granularity).

Conventional architectures for X-tolerance are likely to bypass the compactor if one or more scan chains are having shift failures. This results in many or even most of the patterns being undesirably uncompressed patterns in some scenarios, thereby impacting compression in presence of Xs.

The embodiments and their architectures provide effective/efficient flows for debugging failures in compressed ATPG patterns. The embodiments overcome limitations of scan compression implemented using common industry standard tools and can deliver a better quality of results. The embodiments with observability mechanism for debug can be useful to any digital design teams that implement scan compression. Scan compression can be applied to any large digital circuits, and the debug and X-tol control and other embodiments and teachings in this disclosure are applicable to all classes of digital circuits where scan compression is used.

Various integrated circuits such as soft cores having the embodiments shown in FIGS. 1-7 can be easily tested. ATPG setup with vendor tool supported commands for different incremental ATPG runs help test the embodiments. Hard IPs with debug patterns delivered with non-identical sets of scan out images for a given set of scan in image (image=pattern), when different qualification/disqualification patterns are delivered to data register 560, 660, or 760, indicate or signify operation of the embodiments. Hard IPs with STIL/TDL patterns have a different implied scan structure when some such embodiments are incorporated.

In FIG. 8, IEEE 1500 is used to setup/control many of the test related features within the functional integrated circuit, or IP core, 810 according to the FIG. 8 embodiment as improved in FIGS. 1-3 and 5-7. In this way, an interface couples chip-level test pins with a functional integrated circuit 810 and provides a test wrapper to allow access to the functional integrated circuit 810. The test wrapper has a Wrapper Shift Register 820 for serial entry of instructions and data via a Wrapper Shift Input WSI and can scan out resulting information at Wrapper Shift Output WSO. A Wrapper Instruction Register 830 is coupled and controlled to receive the test instructions from Wrapper Shift Register 820. A Wrapper Data Register 840 is coupled and controlled to receive the test data from Wrapper Shift Register 820 or conversely to deliver resulting data to Wrapper Shift Register 820 for serial scan out at WSO. A set of control signals NRESET, CLKREF, WRCK, WRSTN, SELECTWIR, SHIFTWR, UPDATE WR, AND CAPTUREWR control these operations.

Further in FIG. 8, an 8-wide input WPI[7:0] feeds a Decompressor 860 as well as a Load Execute Dump LED interface and a programmable BIST or PBIST, interface. Decompressor 860 provides and sets up a bit-image for functional integrated circuit 810 to operate upon, and the LED and PBIST interfaces are coupled to control what operations are to occur and be tested. See FIGS. 1-3 and 5-7 for detail of circuits involving Decompressor 860 and Compactor 870. A mux 875 has three inputs respectively fed by a Compactor 870, by an output from the Load Execute Dump LED interface, and by an output from the PBIST interface. Mux 875 delivers an output to WPO[7:0]. Functional integrated circuit 810 also has boundary scan registers that provide Functional I/O and also have a serial input WBI[(W−1):0] and a serial output WBO. FIG. 8 is one illustration of a particular test interface, and various embodiments may lack any of various features such as DMLED, PBIST, etc.

As noted, the embodiments in this disclosure are applicable, among other things, to all classes of digital circuits where scan compression can be used and to all types of systems using such circuits. A system context is depicted in FIG. 9 and described hereinbelow, by way of example and not of limitation.

Figure 9:
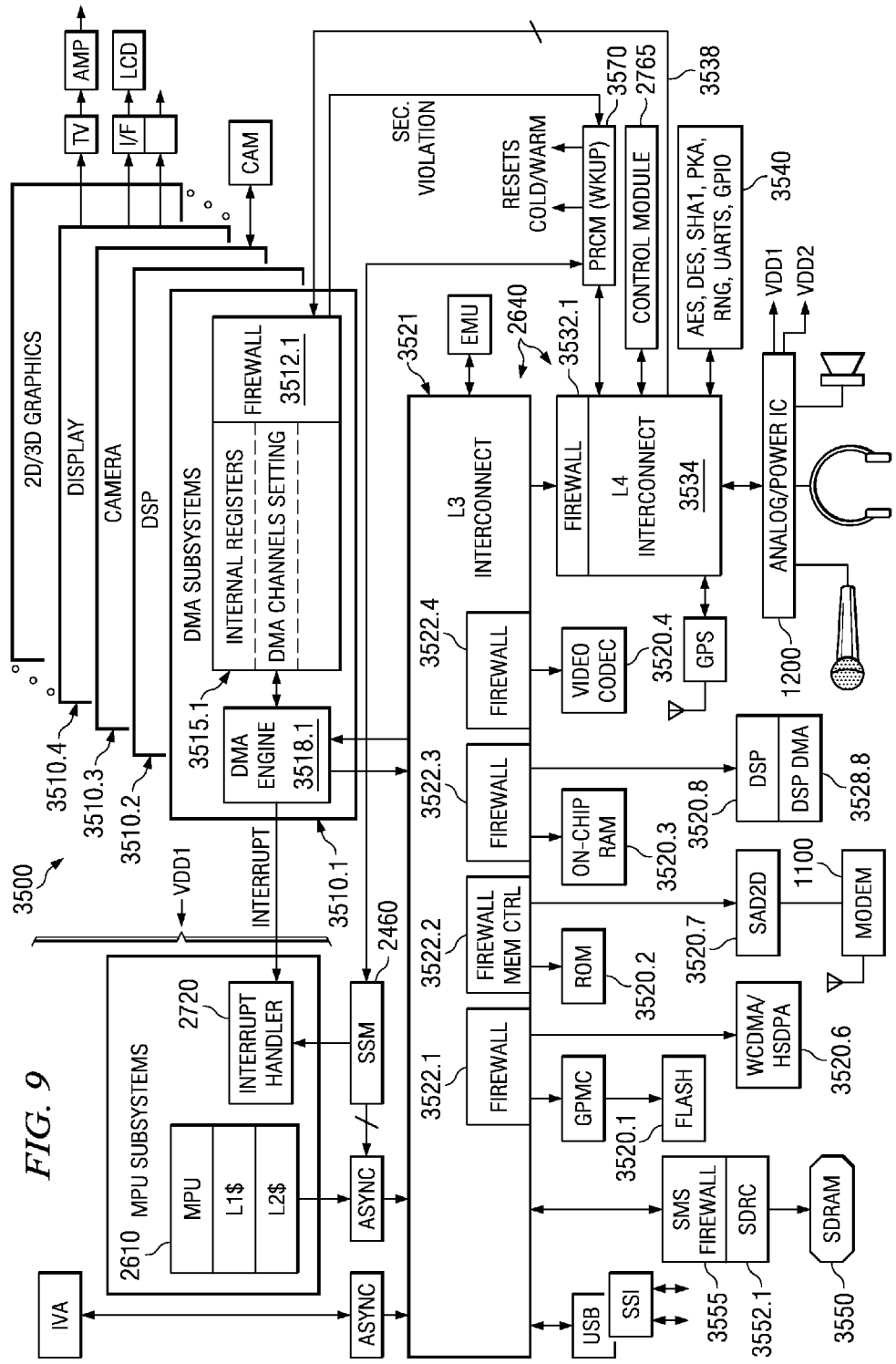
FIG. 9 is a block diagram of an inventive system for multimedia processing and telecommunications improved as shown in the other Figures.

In FIG. 9, a system functional integrated circuit chip embodiment 3500 improved as in the other Figures has an MPU microprocessor unit subsystem and an image and video acceleration IVA subsystem, and DMA (Direct Memory Access) subsystems 3510.$i$. See U.S. Patent Application Publication 20080307240 (TI-60478) "Power Management Electronic Circuits, Systems, and Methods and Processes of Manufacture," which is incorporated herein by reference in its entirety. In FIG. 9, a Modem integrated circuit (IC) 1100 supports and provides communication interfaces for any one or more of such embodiments. The system embodiment examples of FIG. 9 are also provided in a communications system and implemented as various embodiments in any one, some or all of cellular mobile telephone and data handsets, a cellular (telephony and data) base station, a WLAN AP (wireless local area network access point), a Voice over WLAN Gateway with user video/voice over packet telephone, and a video/voice enabled personal computer (PC) with another user video/voice over packet telephone, that communicate with each other. A camera CAM provides video pickup for a cell phone or other device to send over the internet to another cell phone, personal digital assistant/personal entertainment unit, gateway and/or set top box STB with television TV. Various production-testable and/or field-testable system embodiments are provided on a printed circuit board (PCB), a printed wiring board (PWB), and/or in an integrated circuit on a semiconductor substrate.

Figure 10:
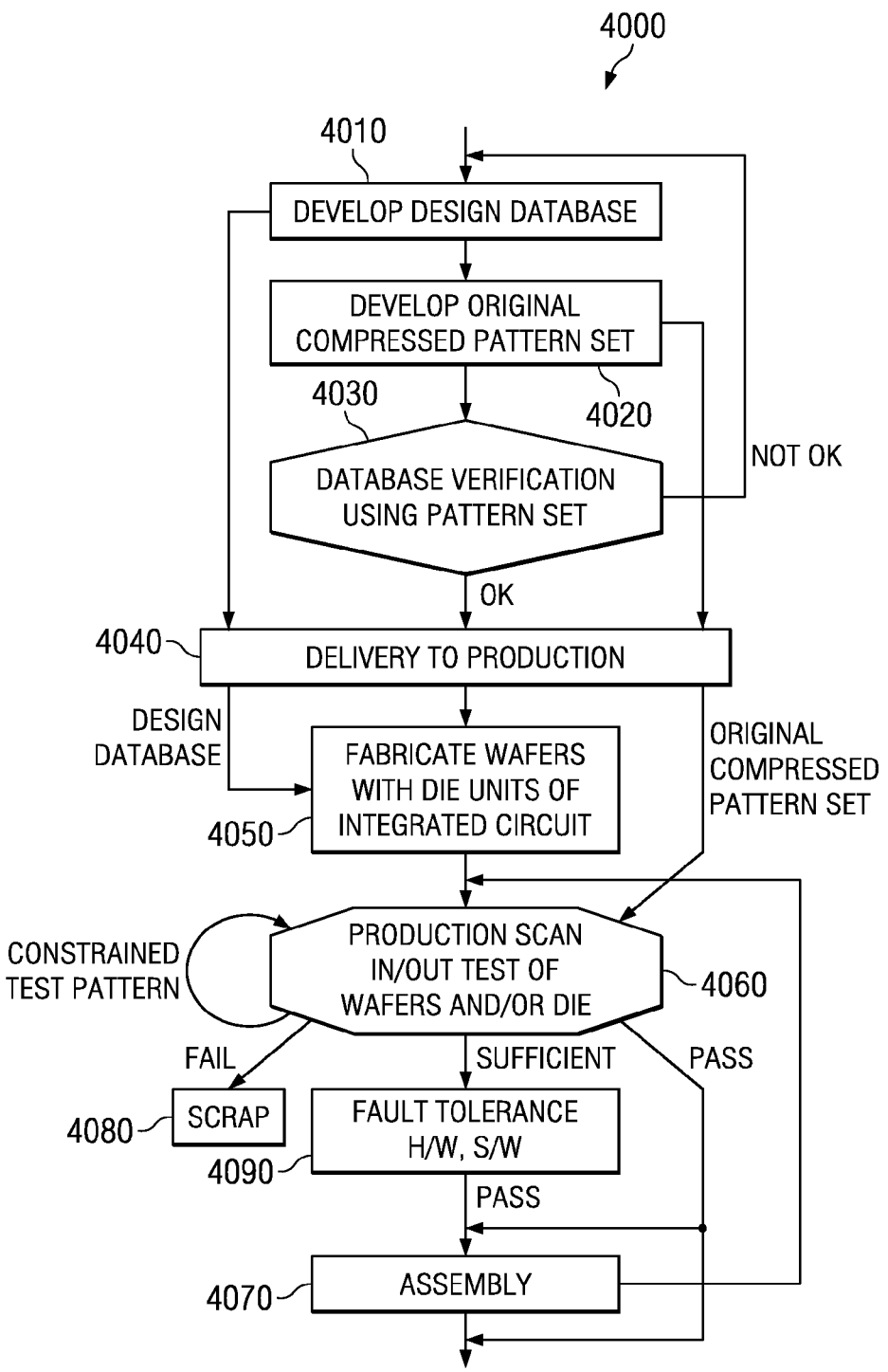
FIG. 10 is a flow diagram of an inventive manufacturing production process making or employing structures as shown in the other Figures.

Various embodiments of an integrated circuit improved as described herein are manufactured according to a suitable process of manufacturing 4000 as illustrated in the flow of FIG. 10. The process prepares a design database in a step 4010 that has RTL (register transfer language), netlist, and transistor-level database with place-and-route for a particular design that also has a scan decompressor and compactor circuit and associated circuitry for testing the functional integrated circuitry. The detailed description describes those examples and various other alternatives. Another step 4020 develops an original compressed pattern set, and the design database is checked and verified in a step 4030 using the pattern set. Any necessary modifications are made to the design database and the pattern set interactively until the verification passes (OK) in step 4030.

At a step 4040, the design database and the original compressed pattern set are delivered from a design site, such as by download from a design server, to a production site like a semiconductor integrated circuit wafer fabrication facility. A step 4050 employs the design database and utilizes fabrication equipment responsive to the design database to manufacture the wafers, which have numerous actual integrated circuit units, each called a die, based on the design data base and to which it pertains. Then the original compressed pattern set is desirably used also as basis for production scan test of the fabricated actual units of the integrated circuit. Production testing 4060 scans patterns from the original compressed pattern set into the integrated circuits, and the ATPG equipment scans out and checks the resulting patterns against expected patterns, see also FIG. 11. If the patterns match, the actual unit or die passes step 4060 as a good die or can go to a step 4070 for assembly, packaging, and subsequent further such testing. If the patterns do not match, the production testing suitably goes through one or more testing iterations and applies constrained test patterns. If the die is irretrievably failed, then a record identifying it and the failure is made, and at a step 4080 that particular die may be ultimately scrapped. However, the testing at step 4060 may instead show that the actual unit is sufficiently functional so that already-present fault-tolerant features in firmware or simple hardware modifications in production, see step 4090, are sufficient to achieve intended full, reliable functionality and pass that integrated circuit unit. In this way, production and design are more closely and efficiently coordinated by using the original compressed pattern set as basis for production scan test of the units.

Figure 11:
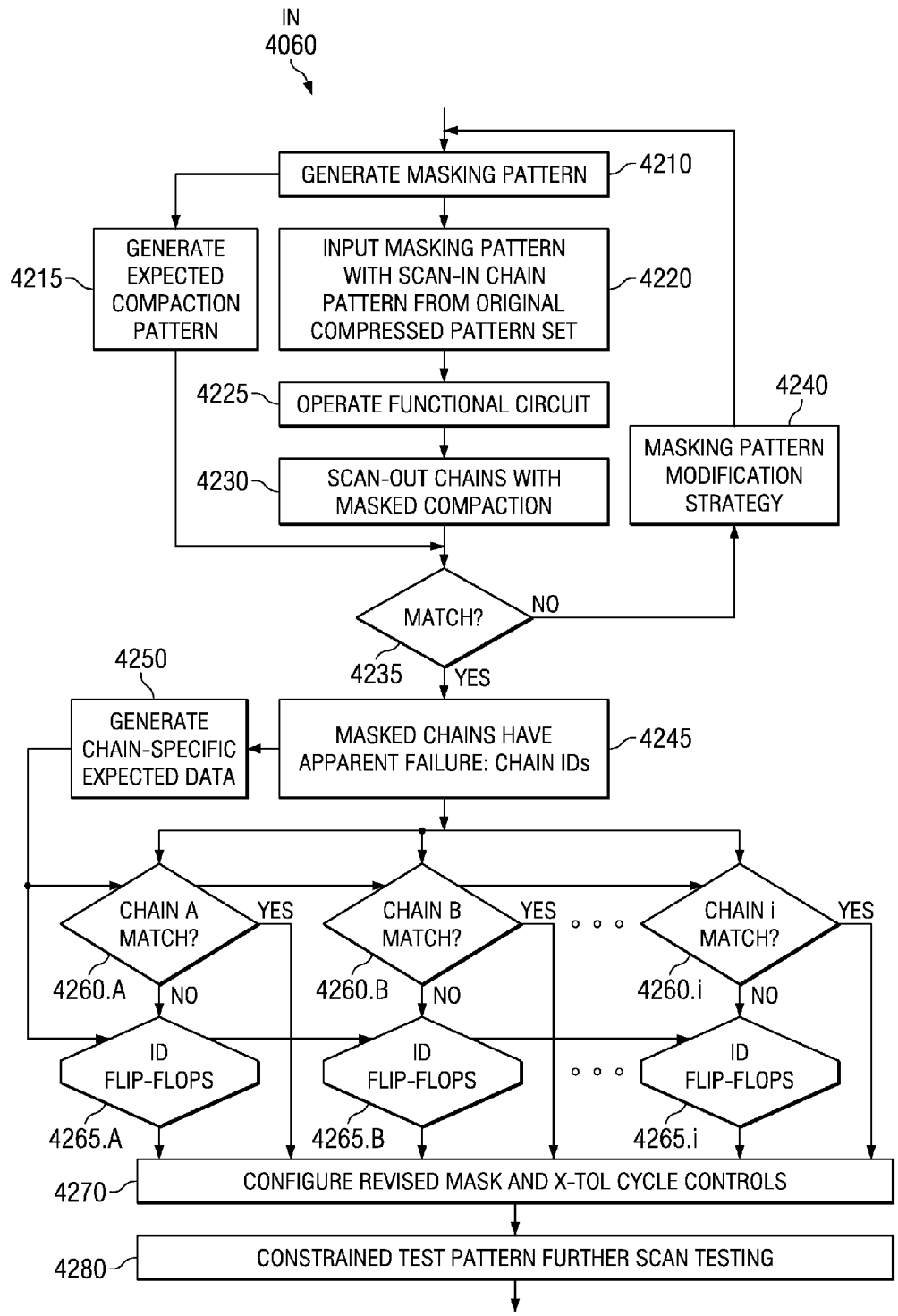
FIG. 11 is a flow diagram of an inventive test process, for production and otherwise, employing structures as shown in the other Figures, and which may also be used as an example of a sub-process in the process of FIG. 10 and in the structure and process of FIG. 4.

FIG. 11 illustrates a test process that uses any of the scan circuitry of the other Figures and as taught herein. FIG. 11 can also be used as a detail illustration for the production testing step 4060 of FIG. 10. In FIG. 11, operations at step 4210 generate a masking pattern and X-tol controls, if any. (Initially, this masking pattern may be a null mask that fully couples all the scan chains to the compactor.) A collateral step 4215 derives an expected compaction pattern expected for the upcoming scan-out data. This expected compaction pattern is derived in step 4215 by applying to the transistor-level design data base a scan-in chain pattern from the original compressed pattern set that was delivered to the production/test facility subject to the step 4210 masking pattern and any X-tol controls from step 4210. Another step 4220 transfers into an actual unit of the chip under test the masking pattern of step 4210 along with the scan-in chain pattern from the original compressed pattern set that was delivered to the production/test facility and on which step 4215 is based. Thus, the original compressed pattern set is used at least in part as input to the production process and is decompressed into the integrated circuit unit. The functional circuitry of the chip under test is operated in a step 4225. Then a step 4230 scans out the scan chains using masked compaction according to the supplied masking pattern and X-tol controls, if any. A comparing step 4235 compares the actual masked compaction data pattern of scanned-out bits, which results from actually performing the production scan test, with the expected compaction pattern from step 4215 to determine if there is a match. If a match, the test passes and further test patterns can be tested and if they match, the chip Passes.

If no match is detected at step 4235 for some test pattern, a step 4240 executes a masking pattern-modification strategy to determine the next masking pattern to use in step 4210 and the process repeats steps 4210-4235. For example, the strategy at step 4240 as discussed elsewhere herein may involve a search by successively dividing sets of scan chains for masking purposes, or may successively mask different sets of scan chains or otherwise. If no match is obtained after all this testing, and for enough test patterns, the chip may have satisfied enough criteria of failure be recorded as failing, and the particulars will depend on the nature of the chip circuitry and the fault-tolerance measures available.

If a match is detected at step 4235 after using the masking pattern-modification strategy of step 4240, then a step 4245 records a fail log of scan chain identification numbers that signify the scan chains that were masked (decoupled by the mask from compaction). These scan chains have an apparent failure somewhere among them. These scan chain identifications A, B, . . . i are used by the tester in a step 4250 to generate chain-specific expected data that is expected for those scan chains A, B, . . . i (if that expected data was not already generated as a byproduct of operations in step 4215). Then a further step 4260 scans out the apparently-failing scan chains A, B, . . . i and executes decision sub-steps 4260.A, 4260.B, . . . 4260.i to respectively compare the scan chain data from each scan chain thus scanned out with expected data from step 4250 for that scan chain. In this way, step 4260 observes some of the scan chains individually. Composite step 4260 narrows down in one pass which such scan chains apparently have a failure depending on which comparisons fail to match. A still further step 4265 has decision sub-steps 4265.A, 4265.B, . . . 4265.i that respectively compare flip-flop by flip-flop the scan chain data from each failed scan chain from step 4260 with the expected data for that scan chain. The comparing 4265 identifies in the same one pass which flip-flops are possibly failing in each such scan chain that has a failure detected by step 4260.

Operations proceed to a step 4270 that derives and configures revised mask and X-tol cycle controls based on the results of steps 4245, 4260.i, and 4265.i. Step 4270, for instance, generates masking configuration bits based on which scanned chains are apparently failing, and scans in the test pattern and masking configuration bits to mask those failing scan chains, at least on some cycles, and thereby define and introduce a constrained test pattern. The X-tol cycle-by-cycle controls are fed in based on which flip-flops are possibly failing. Further scan-out production testing 4280 is then performed, such as by compaction of the information from the scan chains. The testing operates the functional circuitry and then scans out the internal scan chains by applying the configured masking and modulating with the X-tol cycle-by-cycle controls. Then further comparisons are performed and testing decisions made analogous to already-described steps in these FIGS. 10-11.

The compressed scan chain diagnostic circuitry facilitates testing of operations in RISC (reduced instruction set computing), CISC (complex instruction set computing), DSP (digital signal processors), microcontrollers, PC (personal computer) main microprocessors, math coprocessors, VLIW (very long instruction word), SIMD (single instruction multiple data) and MIMD (multiple instruction multiple data)

processors and coprocessors as cores or standalone integrated circuits, and in other integrated circuits and arrays. The compressed scan chain diagnostic circuitry is useful in other types of integrated circuits such as ASICs (application specific integrated circuits) and gate arrays and to all circuits with structures and analogous problems to which the advantages of the improvements described herein commend their use.

In addition to inventive structures, devices, apparatus and systems, processes are represented and described using any and all of the block diagrams, logic diagrams, and flow diagrams herein. Block diagram blocks are used to represent both structures as understood by those of ordinary skill in the art as well as process steps and portions of process flows. Similarly, logic elements in the diagrams represent both electronic structures and process steps and portions of process flows. Flow diagram symbols herein represent process steps and portions of process flows in software and hardware embodiments as well as portions of structure in various embodiments of the invention.

ASPECTS (See Notes paragraph at end of this Aspects section.)

41A. The process claimed in claim 41 wherein the process is performed on a functional integrated circuit selected from the group consisting of 1) wireless modem circuit, 2) applications processor circuit, 3) digital signal processor circuit, 4) cellular telephone circuit, 5) digital camera circuit, 6) analog circuit, 7) CISC processor, 8) RISC processor, 9) personal computer main microprocessor, 10 application specific integrated circuit (ASIC), 11) gate array.

41B. The process claimed in claim 41 wherein the process is performed on a functional circuit of any type capable of having the scan chains integrated with the functional circuit.

51A. The process claimed in claim 51 further comprising changing setup and header content of the pattern set and in a test description language to observe at least some of the internal scan chains individually.

51B. The process claimed in claim 51 further comprising downloading controls to an instruction register and data register of a scan test access port to control the observation of the internal scan chains individually.

51C. The process claimed in claim 51 wherein production scan test generates a fail log that shows which scan channel and pattern is failing, and the existing pattern set includes internal scan chain data and test description code, and the process further comprises electronically creating additional test description language code using the existing pattern set and fail log to control scan out of internal scan chain data.

51D. The process claimed in claim 51C wherein the electronically creating additional test description code includes electronically copying the internal scan chain data onto new test description language so that for each failing pattern set, the process creates a new test description language pattern set.

51E. The process claimed in claim 51D wherein such new test description language pattern set brings a set of the internal scan chains out to one or more top scan out pins of the integrated circuit, one set of scan chains equal to the number of top level scan out pins per pattern set.

51F. The process claimed in claim 51 further comprising performing the production scan test in a way that includes compacting scan bits from the internal scan chains.

51F1. The process claimed in claim 51F for use with an integrated circuit having an output compactor wherein performing the scan test with compacting retains the output compactor and compacts scan bits from the internal scan chains whereby obviating scan bypass mode patterns.

T1. A process of testing a testing control circuit for a known good functional integrated circuit having internal scan chains, the process comprising:
    setting up an automated test pattern generation (ATPG) tool with at least one scan-in bits-image for that integrated circuit;
    coupling the ATPG tool to the integrated circuit to scan in that bits-image into internal scan chains therein;
    also introducing different qualification/disqualification masking patterns for testing control of the masking selection of one or more scan chains for scan out;
    scanning out the scan chains using different masking patterns for the testing control;
    comparing the data from the scanning out that used those different masking patterns, whereby the testing control circuit for the integrated circuit passes a first test if non-identical sets of scan out images result; and
    comparing a compacted scan out image expected from at least one specified set of scan chains for a match with a scan out image actually compacted for those scan chains when the masking pattern masks all but the specified set of scan chains, whereby a match further indicates the testing control circuit passes.

T1A. The process claimed in claim T1 for further use with another integrated circuit nominally having the same functional circuitry and scan chains and the process further comprising initially compacting all the scan chains, detecting that compaction fails to match a pre-determined pattern expected for all the scan chains thus compacted; scanning out with different masking patterns until for a given masking pattern the compaction matches a pre-determined pattern expected for masked compaction of the scan chains; and bypassing the compaction to deliver for analysis the scan outputs for that the scan chains that were masked by the given masking pattern.

Notes about Aspects above: Aspects are paragraphs which might be offered as claims in patent prosecution. The above dependently-written Aspects have leading digits and internal dependency designations to indicate the claims or aspects to which they pertain. Aspects having no internal dependency designations have leading digits and alphanumerics to indicate the position in the ordering of claims at which they might be situated if offered as claims in prosecution.

Processing circuitry comprehends digital, analog and mixed signal (digital/analog) integrated circuits, ASIC circuits, PALs, PLAs, decoders, memories, and programmable and nonprogrammable processors, microcontrollers and other circuitry. Internal and external couplings and connections can be ohmic, capacitive, inductive, photonic, and direct or indirect via intervening circuits or otherwise as desirable. Process diagrams herein are representative of flow diagrams for operations of any embodiments whether of hardware, software, or firmware, and processes of manufacture thereof. Flow diagrams and block diagrams are each interpretable as representing structure and/or process. While this invention has been described with reference to illustrative embodiments, this description is not to be construed in a limiting sense. Various modifications and combinations of the illustrative embodiments, as well as other embodiments of the invention may be made. The terms including, includes, having, has, with, or variants thereof are used in the detailed description and/or the claims to denote non-exhaustive inclusion in a manner similar to the term comprising. The appended claims and their equivalents cover any such embodiments, modifications, and embodiments as fall within the scope of the invention.

What is claimed is:

1. Electronic scan circuitry comprising:
a decompressor;
a plurality of scan chains fed by the decompressor;
a masking circuit fed by the plurality of scan chains, the scan chains scannable to scan them out in scan out cycles through the masking circuit; and
a scannable masking qualification circuit coupled to the masking circuit and operable both to select at least one of the plurality of scan chains for disqualification and to execute the disqualification on a selected scan out cycle, the scannable masking qualification circuit including a scan-programmable shift register fed by the decompressor and accommodating at least a number n of scan programming bits and having substantially $m=\log_2(N/n)$ cells for each of a number n of sets among all N of the scan chains masked by the masking circuit.

2. The electronic scan circuitry of claim 1 including a tester operable to configure the scannable masking qualification circuit in response to detection of unknown state content at a position in the at least one of the plurality of scan chains to disqualify the unknown state content by the masking circuit.

3. The electronic scan circuitry of claim 1 in which the scannable masking qualification circuit is responsive to a modulating input to effectively switch between different masks depending on the state of the modulating input on the scan out cycle.

4. The electronic scan circuitry of claim 1 including a generator circuit coupled to the masking qualification circuit to control the disqualification on a selected scan out cycle and the generator circuit having at least one programmable register responsive to a scan input.

5. The electronic scan circuitry of claim 1 in which the masking qualification circuit includes a multiplexer having a selector input fed from an X-tol enable circuit selected from the group consisting of 1) top level X-tol enable pin, 2) core data register, 3) on-chip X-tol generator.

6. The electronic scan circuitry of claim 1 including a programmable X-tol generator and in which the masking qualification circuit includes a multiplexer having a selector input fed from the X-tol generator.

7. The electronic scan circuitry of claim 1 including at least one cycle identification register, a shift-cycle counter, and a comparator fed by the register and the counter, the comparator coupled to enable the masking circuit to provide masking controls to the masking qualification circuit or not cycle-by-cycle on scan-out of the scan chains.

8. The electronic scan circuitry of claim 1 including a scan-control circuit coupled to the plurality of scan chains to scan them in and out, and the scannable masking qualification circuit is also fed by the decompressor along with the scan chains on scan-in, and the scannable masking qualification circuit is at least partially isolated from control by the scan-out circuit on scan-out.

9. The electronic scan circuitry of claim 1 including a set of scan-in pattern bits elements to enable the masking qualification circuit to provide masking controls to the masking circuit or not, on a cycle-by-cycle basis.

10. The electronic scan circuitry of claim 1 including a functional integrated circuit, the scan chains coupled with parts of the functional integrated circuit, the functional integrated circuit selected from the group consisting of 1) wireless modem circuit, 2) applications processor circuit, 3) digital signal processor circuit, 4) cellular telephone circuit, 5) digital camera circuit, 6) analog circuit, 7) CISC processor, 8) RISC processor, 9) personal computer main microprocessor, 10 application specific integrated circuit (ASIC), 11) gate array.

11. The electronic scan circuitry of claim 1 including a functional integrated circuit chip integrally coupled with the scan chains, chip-level test pins, an on-chip compactor fed by the masking circuit, and an interface including an on-chip test wrapper that couples the chip-level test pins with the decompressor on-chip and the compactor.

* * * * *